US009823415B2

(12) United States Patent
Andle et al.

(10) Patent No.: US 9,823,415 B2
(45) Date of Patent: Nov. 21, 2017

(54) ENERGY CONVERSION CELLS USING TAPERED WAVEGUIDE SPECTRAL SPLITTERS

(71) Applicant: Shalom Wertsberger

(72) Inventors: Jeffrey C Andle, Falmouth, ME (US); Shalom Wertsberger, Rochester, NY (US)

(73) Assignee: CRTRIX Technologies, Rochester, NY (US)

( * ) Notice: Subject to any disclaimer, the term of this patent is extended or adjusted under 35 U.S.C. 154(b) by 133 days.

(21) Appl. No.: 14/425,500

(22) PCT Filed: Sep. 9, 2013

(86) PCT No.: PCT/US2013/058836
§ 371 (c)(1),
(2) Date: Mar. 3, 2015

(87) PCT Pub. No.: WO2014/043045
PCT Pub. Date: Mar. 20, 2014

(65) Prior Publication Data
US 2015/0234122 A1    Aug. 20, 2015

Related U.S. Application Data

(63) Continuation-in-part of application No. 13/831,575, filed on Mar. 14, 2013, now Pat. No. 9,112,087, and (Continued)

(30) Foreign Application Priority Data

Dec. 14, 2012    (GB) .................................... 1222557.9

(51) Int. Cl.
G02B 6/122    (2006.01)
H02M 3/07    (2006.01)
(Continued)

(52) U.S. Cl.
CPC ....... *G02B 6/1228* (2013.01); *G02B 6/12002* (2013.01); *G02B 6/4298* (2013.01);
(Continued)

(58) Field of Classification Search
CPC ......... G02B 6/1228; G02B 6/42; H02M 3/07; H01L 31/0232
(Continued)

(56) References Cited

U.S. PATENT DOCUMENTS 2,433,368 A    12/1947    Johnson et al.
2,992,587 A    7/1961    Hicks, Jr. et al.
(Continued)

FOREIGN PATENT DOCUMENTS

DE    4409698    3/1994
EP    1221760    7/2002
(Continued)

OTHER PUBLICATIONS

"Plasmonic Rainbow Trapping Structures for Light Localization and Spectrum Splitting" Min Seok Jang and Harry Atwater, Physical Review Letters 107, 207401 (2011), Nov. 11, 2011, American Physical Society.
(Continued)

*Primary Examiner* — Seung C Sohn
(74) *Attorney, Agent, or Firm* — Shalom Wertsberger; Saltamar Innovations

(57) ABSTRACT

An energy converter for converting multi-frequency radiant energy into electrical energy is disclosed, comprising a plurality of superposed lateral waveguides having photovoltaic energy transducers disposed within. The waveguide include charge collectors, which may be the cladding. A plurality of spectral refractors termed Continuous Resonant Trap Refractors (CRTR) are disposed within the lateral waveguides the refractors comprising a tapered core wave-
(Continued)

guide, the wider end of which defining an aperture, and the tapered core width decreasing in magnitude as a function of the depth. A cladding is disposed about the tapered core. The aperture of the tapered core is dimensioned to allow passage of radiant energy comprising at least two frequencies. The varying width of the tapered core will cause different frequencies to reach a state at which they will penetrate the cladding and be emitted from the spectral refractor sorted by depth, and be coupled to respective lateral waveguides and/or transducers.

17 Claims, 13 Drawing Sheets

Related U.S. Application Data a continuation-in-part of application No. 13/685,691, filed on Nov. 26, 2012, now Pat. No. 8,530,825, and a continuation-in-part of application No. 13/726,044, filed on Dec. 22, 2012, now Pat. No. 8,532,448.

(60) Provisional application No. 61/701,687, filed on Sep. 16, 2012, provisional application No. 61/713,602, filed on Oct. 14, 2012, provisional application No. 61/718,181, filed on Oct. 24, 2012, provisional application No. 61/723,773, filed on Nov. 7, 2012, provisional application No. 61/723,832, filed on Nov. 8, 2012, provisional application No. 61/724,920, filed on Nov. 10, 2012, provisional application No. 61/801,619, filed on Mar. 15, 2013, provisional application No. 61/801,431, filed on Mar. 15, 2013, provisional application No. 61/786,357, filed on Mar. 15, 2013.

(51) Int. Cl.
    *H01L 31/054* (2014.01)
    *G02B 6/42* (2006.01)
    *G02B 6/12* (2006.01)
    *H01L 27/146* (2006.01)

(52) U.S. Cl.
    CPC ........ *H01L 31/054* (2014.12); *H01L 31/0549* (2014.12); *H02M 3/07* (2013.01); *G02B 6/12007* (2013.01); *H01L 27/14629* (2013.01); *Y02E 10/52* (2013.01); *Y10T 307/696* (2015.04)

(58) Field of Classification Search
    USPC .................................................. 250/227.23
    See application file for complete search history.

(56) References Cited

U.S. PATENT DOCUMENTS

| | | |
|---|---|---|
| 3,310,439 A | 3/1967 | Seney |
| 3,422,527 A | 1/1969 | Gault |
| 4,076,378 A | 2/1978 | Cole |
| 4,251,679 A | 2/1981 | Zwan |
| 4,332,973 A | 6/1982 | Sater |
| 4,358,770 A | 11/1982 | Satoh |
| 4,409,422 A | 10/1983 | Sater |
| 4,496,876 A | 1/1985 | Young |
| 4,680,558 A | 7/1987 | Gosh et al. |
| 4,842,357 A | 6/1989 | Doneen |
| 4,923,276 A | 5/1990 | Wells |
| 4,932,032 A | 6/1990 | Koch et al. |
| 5,060,119 A | 10/1991 | Parthasarathy |
| 5,192,863 A | 3/1993 | Kavehrad et al. |
| 5,343,542 A | 8/1994 | Kash et al. |
| 5,375,178 A | 12/1994 | Van Der Tol |
| 5,526,449 A | 6/1996 | Meade et al. |
| 5,784,507 A | 7/1998 | Holm-Kennedy |
| 5,923,795 A | 7/1999 | Toyohara |
| 6,151,427 A | 11/2000 | Satorius |
| 6,326,939 B1 * | 12/2001 | Smith ............... G02B 6/08 345/32 |
| 6,374,024 B1 | 4/2002 | Iijima |
| 6,438,296 B1 * | 8/2002 | Kongable ............... G02B 6/04 356/4.01 |
| 6,628,242 B1 | 9/2003 | Hacker et al. |
| 6,819,861 B2 | 11/2004 | Ota |
| 6,919,862 B2 | 7/2005 | Hacker |
| 6,992,639 B1 | 1/2006 | Lier |
| 7,397,977 B2 | 7/2008 | Hashimoto et al. |
| 7,483,615 B2 | 1/2009 | Mihailove et al. |
| 7,526,167 B1 | 4/2009 | Minelly |
| 7,623,745 B2 | 11/2009 | Podolski et al. |
| 7,799,988 B2 | 9/2010 | Cutler |
| 7,902,453 B2 | 3/2011 | Dutta |
| 7,943,847 B2 | 5/2011 | Kempa et al. |
| 7,999,174 B2 | 8/2011 | Moslehi |
| 8,012,382 B2 | 9/2011 | Kim et al. |
| 9,348,078 B2 | 5/2016 | Layton et al. |
| 2005/0007289 A1 | 1/2005 | Zarro et al. |
| 2005/0018272 A1 | 1/2005 | Kimura |
| 2005/0029536 A1 | 2/2005 | Sugitatsu |
| 2005/0041924 A1 | 2/2005 | Bouadma et al. |
| 2005/0207699 A1 | 9/2005 | Painter et al. |
| 2006/0098918 A1 | 5/2006 | Noda et al. |
| 2007/0034250 A1 | 2/2007 | Dutta |
| 2007/0063791 A1 | 3/2007 | Wu et al. |
| 2008/0047601 A1 | 2/2008 | Nag et al. |
| 2009/0052852 A1 | 2/2009 | Mikovich et al. |
| 2009/0086298 A1 | 4/2009 | Okorogu |
| 2009/0116804 A1 * | 5/2009 | Peng ............... G11B 5/314 385/131 |
| 2009/0199893 A1 | 8/2009 | Bita et al. |
| 2009/0252456 A1 | 10/2009 | Rasras |
| 2010/0085573 A1 * | 4/2010 | Lu ............... G01N 21/7746 356/480 |
| 2010/0108133 A1 | 5/2010 | Bhagavatula |
| 2010/0015560 A1 | 6/2010 | Scherer et al. |
| 2010/0202734 A1 | 8/2010 | DeCorby |
| 2011/0002585 A1 | 1/2011 | Gibson et al. |
| 2011/0019186 A1 | 1/2011 | Himmelhaus et al. |
| 2011/0277361 A1 | 11/2011 | Nichol |
| 2012/0000638 A1 | 1/2012 | Dagli et al. |
| 2012/0135512 A1 | 5/2012 | Vasyleyev |
| 2015/0228813 A1 | 8/2015 | Wertsberger et al. |
| 2015/0247971 A1 | 9/2015 | Wertsberger et al. |
| 2015/0301275 A1 | 10/2015 | Andle et al. |

FOREIGN PATENT DOCUMENTS

| | | |
|---|---|---|
| GB | 1416154 | 12/1975 |
| GB | 24584526 | 4/2012 |
| JP | 61 249004 A | 11/1986 |
| JP | S61 249004 | 11/1986 |
| JP | 2005316059 | 11/2005 |
| JP | 2007108190 | 4/2007 |
| JP | 2008 064653 | 3/2008 |
| JP | 2008 064653 A | 3/2008 |
| WO | WO1992/10014 | 6/1992 |
| WO | WO2004036265 | 4/2004 |
| WO | WO2010039199 | 4/2010 |
| WO | WO2010/065099 | 6/2010 |
| WO | WO2010076791 | 7/2010 |

OTHER PUBLICATIONS

"DOE Solar Energy Technologies program Peer Review" Harry A. Attwater, Nathan S. Lewis, Mar. 9-10, 2009 Denver, CO, US Department of Energy.

"Multi-Bandgap High Efficiency Converter (Rainbow)", Carol R. Lewis **, Wayne M. Phillips, Virgil B. Shields and Paul M. Stella,

(56) References Cited

OTHER PUBLICATIONS

Ivan Bekey, Jet Propulsion Laboratory, Pasadena, California Institute of Technology.
"Trapping a Rainbow: Researchers Slow Broadband Light Waves With Nanoplasmonic Structures", Science Daily Mar. 15, 2011, www.sciencedily.com /releases/2011/03/110314152921.htm.
"Visible-band dispersion by a tapered air-core Bragg waveguide" B. Drobot, A. Melnyk, M. Zhang, T.W. Allen, and R.G. DeCorby, Oct. 8, 2012 / vol. 20, No. 21 / Optics Express 23906, ©2012 Optical Society of America.
Extraordinary optical transmission through metal films with sub wavelength holes and "slits" , A. S. Vengurlekar, Tata Institute of Fundamental Research, Mumbai 400005, MS Completed in Oct. 2009, to appear in Current Science, J. of Ind. Acad .Science.
"Efficiency and finite size effects in enhanced transmission through subwavelength apertures", F. Przybilla, A. Degiron, C. Genet, T.W. Ebbesen, F. de L'eon-P'erez, J. Bravo-Abad, F. J.Garc'ia-Vidal, L. Mart'in-Moreno. Jun. 23, 2008 / vol. 16, No. 13 / Optics Express 9571, © 2008 Optical Society of America.
"Nanoscale Devices for Rectification of High Frequency Radiation from the Infrared through the Visible: A New Approach" N. M. Miskovsky, P. H. Cutler, A. Mayer, B. L. Weiss, Brian Willis, T. E. Sullivan, and P. B. Lerner Copyright © 2012 N. M. Miskovsky et al. Journal of Nanotechnology vol. 2012 (2012), Article ID 512379.
Light transmission through perforated metal thin films made by island lithography, Mino Green, Futing Yi, 2004 Elsevier B.V. Available online Jul. 2, 2004.
"Trapping light in plasmonic waveguides", Junghyun Park, Kyoung-Youm Kim, II-Min Lee, Hyunmin Na, Seung-Yeol Lee, and Byoungho Lee, Jan. 18, 2010 / vol. 18, No. 2 / Optics Express 598, © 2010 Optical Society of America.
"Stopping light by an air waveguide with anisotropic metamaterial cladding" Tian Jiang, Junming Zhao and Yijun Feng, Jan. 5, 2009 / vol. 17, No. 1 / Optics Express 170, © 2008 Optical Society of America.
"Light transmission through a single cylindrical hole in a metallic film" F. J. Garc'ia de Abajo Dec. 2002 / vol. 10, No. 25/ Optics Express 1475 © 2002 Optical Society of America.
"Transmission of light through thin silver films via surface plasmon-polaritons", Armando Giannattasio, Ian R. Hooper, and William L. Barnes. Nov. 29, 2004 / vol. 12, No. 24 / Optics Express 5881, ® 2004 Optical Society of America.
"Experimental verification of the "rainbow" trapping effect in plasmonic graded gratings" Qiaoqiang Gan, Yongkang Gao, Kyle Wagner, Dmitri V. Vezenov, Yujie J. Ding, and Filbert J. Bartoli.
"Rainbow Trapping in Hyperbolic Metamaterial Waveguide", Haifeng Hu, Dengxin Ji, Xie Zeng, Kai Liu & Qiaoqiang Gan, Scientific Report 3, Article No. 1249, Feb. 13, 2013, Nature.com,© 2013 Nature Publishing Group, a division of Macmillan Publishers Limited. Creative Commons.
"Photonic Design Principles for Ultrahigh—Efficiency Photovoltaics", Albert Polman and Harry Atwater, Nature Materials vol. 11, Mar. 2012, © 2012 Macmillan Publishers Limited.
"Surface-Plasmon-assisted resonant tunneling of light through a periodically corrugated thin metal film", Ivan Avrutzki, Yang Zhao, and Vladimir Kochergin, Optics Letter vol. 25, No. 9, May 1, 2000 © 2000 Optical Society of America.
"Let the Light in", PV Magazine Oct. 2012 www.pv-magazine.com, Berlin, Germany.
Trapped Rainbow 'storage of light in metamterials', Kosmas L Tsakmakidis, Allan D. Boardman & Ortwin Hess, Nature vol. 450, Nov. 25, 2007 397-401 © 2007 Nature Publishing Group.
"Efficient Harvesting of Solar Energy with Rectennsa", Steve Hall, Yi Huang, Yoachun Shden and Paul Claker, University of Liverpool, Liverpool England, Sep. 2011.
United Kingdom Intellectual Property Office Search Report in GB 1222557.9, "Continuous Resonant Trap Refractor, Waveguide Based Energy Detectors, Energy Conversion Cells, and Display Panels Using Same ", Feb. 1, 2013.

* cited by examiner

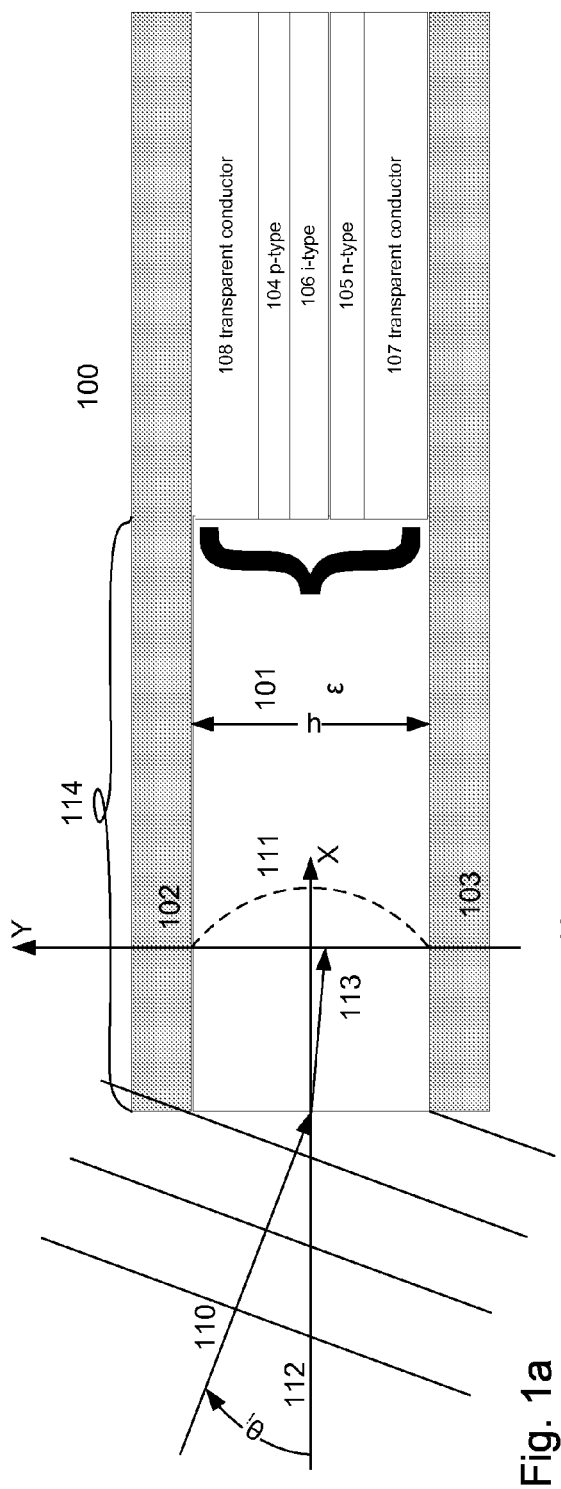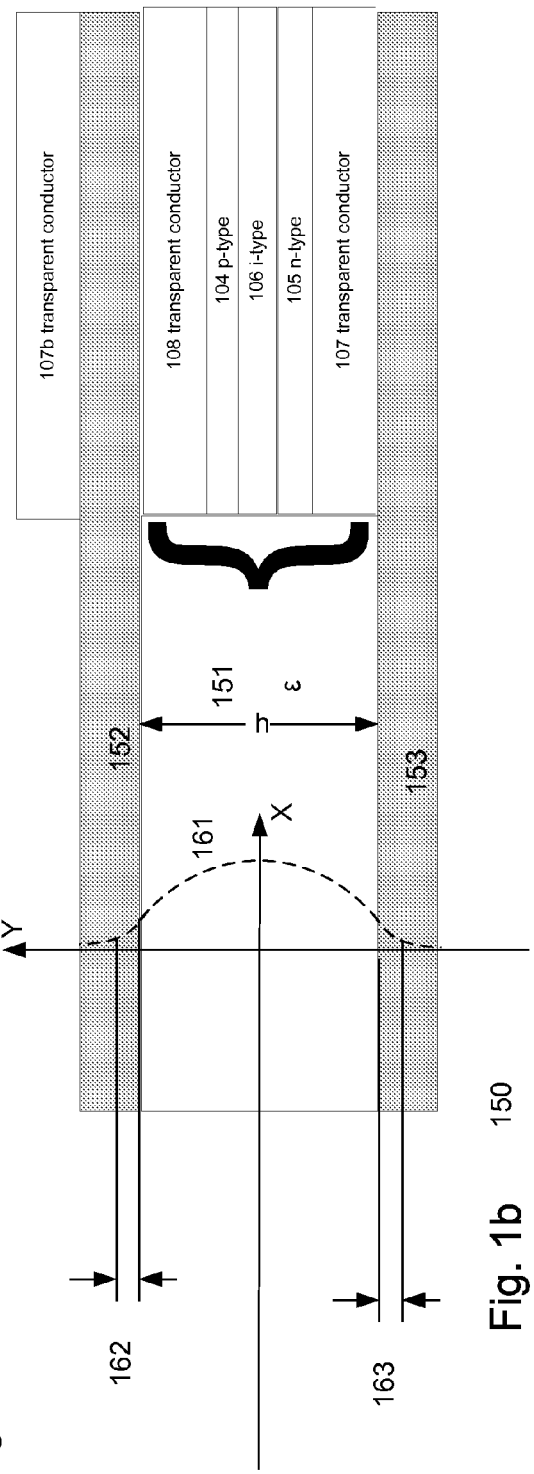
Fig. 1a
Fig. 1b

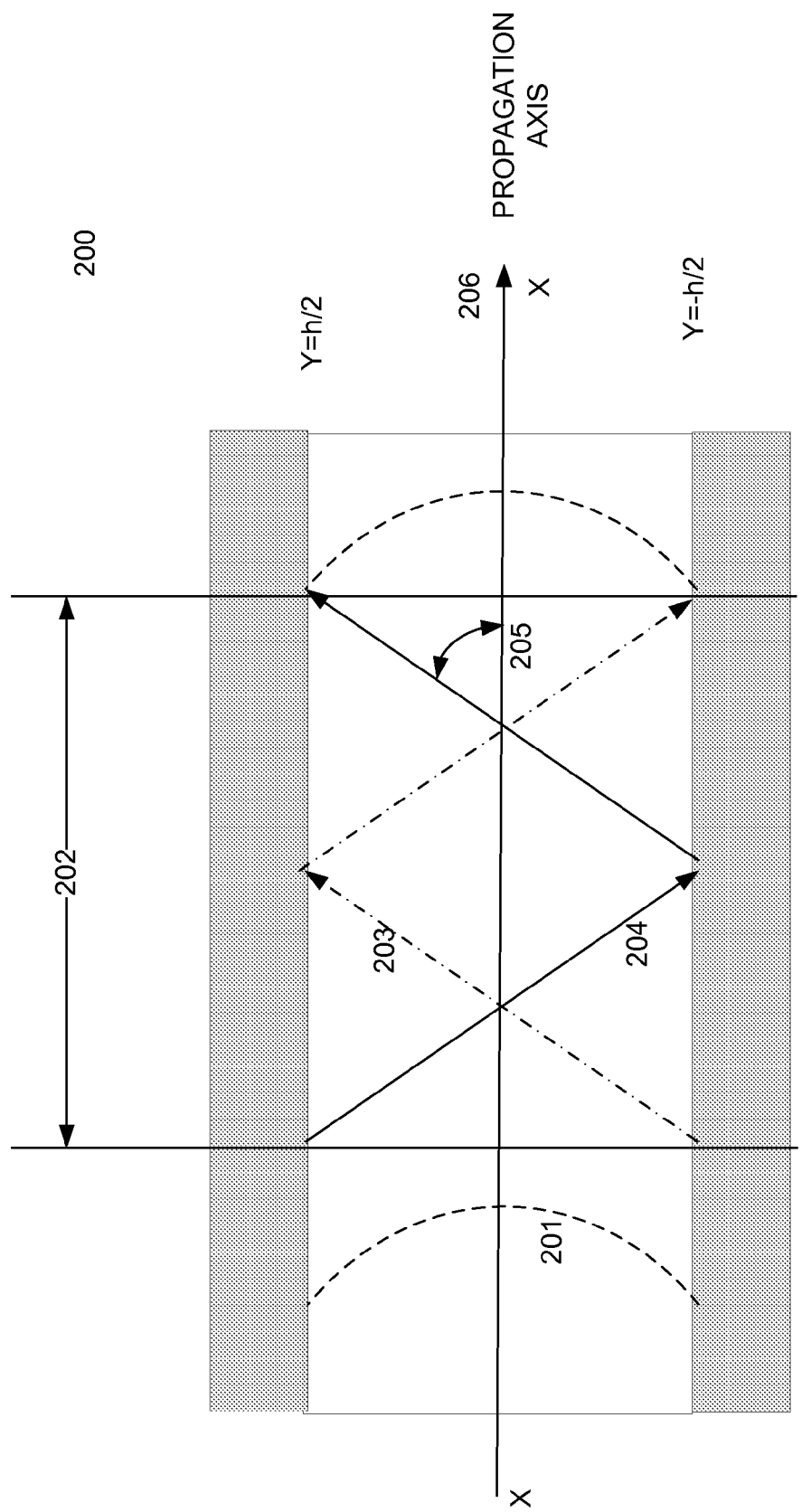

ENERGY CONVERSION CELLS USING TAPERED WAVEGUIDE SPECTRAL SPLITTERS

RELATED APPLICATIONS

Aspects of the present invention were first disclosed in U.S. Patent Application 61/701,687 to Andle and Wertsberger, entitled "Continuous Resonant Trap Refractor, Waveguide Based Energy Transducers, Energy Conversion Cells, and Display Panels Using Same", filed 16 Sep. 2012. Further refinements of the tapered waveguide based Continuous Resonant Trap Refractor (CRTR) and to lateral waveguides with which CRTRs may cooperate, were disclosed together with various practical applications thereof in the following additional U.S. Patent Applications: 61/713,602, entitled "Image Array Sensor", filed 14 Oct. 2012; 61/718,181, entitled "Nano-Scale Continuous Resonance Trap Refractor", filed 24 Oct. 2012; 61/723,832, entitled "Pixel Structure Using Tapered Light Waveguides, Displays, Display Panels, and Devices Using Same", filed 8 Nov. 2012; 61/723,773, entitled "Optical Structure for Banknote Authentication", filed 7 Nov. 2012; Ser. No. 13/726,044 entitled "Pixel Structure Using Tapered Light Waveguides, Displays, Display Panels, and Devices Using Same", filed 22 Dec. 2012; Ser. No. 13/685,691 entitled "Pixel structure and Image Array Sensors Using Same", filed 26 Nov. 2012; Ser. No. 13/831,575 entitled "Waveguide Based Energy Converters, and energy conversion cells using same" filed Mar. 15, 2013; 61/786,357 titled "Methods of Manufacturing of Continuous Resonant Trap Structures, Supporting Structures Thereof, and Devices Using Same" filed Mar. 15, 2013, 61/801,619 titled "Tapered Waveguide for Separating and Combining Spectral Components of Electromagnetic Waves" filed Mar. 15, 2013, U.S. 61/801,431 titled "Continues Resonant Trap Refractors, lateral waveguides, and devices using same" filed Mar. 15, 2013, all to Andle and Wertsberger; and 61/724,920, entitled "Optical Structure for Banknote Authentication, and Optical Key Arrangement for Activation Signal Responsive to Special Light Characteristics", filed 10 Nov. 2012, to Wertsberger. Furthermore Patent application GB 1222557.9 filed Dec. 14, 2012 claims priority from U.S. 61/701,687. All of the above-identified patent applications are hereby incorporated herein by reference in their entireties.

FIELD OF THE INVENTION

The present invention relates generally to cells providing radiant energy to electrical conversion, and more particularly to cells using resonance based polychromatic radiant energy splitters.

BACKGROUND OF THE INVENTION

There is a constantly growing demand for electrical power. Most electricity generated today is produced by magnetic field interaction with a conductor. Rotary generators—such as power station generators, car alternators, dynamos, and the like—move a magnetic field and a conductor relative to each other, and generate electricity. However this type of machinery requires kinetic energy, largely derived from fossil fuel, which is expensive and carries an environmental cost.

In solar power systems, energy is obtained by directly harnessing the electromagnetic solar radiation from the sun. The total solar radiation incident on the earth far exceeds the total power requirements well into the future and offers a viable offset to fossil fuels. Significant effort has been directed to higher utilization of solar energy but efficiency, space, and cost considerations hampered this effort to date.

In its most basic form, the term 'refraction' means the change of direction of a ray of light, sound, heat, radio waves, and other forms of wave energy, as it passes from one medium to another. Generally waves of different frequencies would refract at different angles and thus refraction tends to spatially separate multispectral radiation into its component frequencies.

Electromagnetic (EM) radiant energy extends over a broad frequency spectrum, however many applications deal only with portions of this spectrum. Light is one form of radiant energy which may be considered as an alternating EM radiation at very high frequency. Humans perceive different light frequencies as different colors, and there is a large amount of radiation that is not perceived by humans, generally known as UV (Ultra Violet), and IR (Infra Red), and the term light will be extended thereto. Visible light ranges generally between 760-300 nm and roughly corresponds to the peak intensity of solar radiation transmitted through the atmosphere. Infrared radiation ranges from the extreme far end of 1 mm (33 THz; millimeter radio waves) to about 760 nm. As the human eye is capable of directly sensing and differentiating between light of different frequencies, it will be used oftentimes to explain the operation of different aspects of the invention for the sake of brevity and increased clarity. However the spectral range of interest of different embodiments of the present invention, and the principle described herein, extend to any electromagnetic radiant energy and thus the all or portions of the solar and infrared (IR) spectrum unless otherwise specified or clear from the context.

For solar energy applications the spectral range of interest will likely be a spectrum containing most if not all of the solar spectrum available at the location where the solar cell is to be deployed, or the portion thereof which is economically used by the device at hand, typically of wavelength within the 1.8 µm to 300 nm. Yet, for devices directed to heat energy recovery, it is likely that only the infra-red portion of the spectral range is of interest. Similarly, the spectral range of interest may be applicable to portions of a device, such that by way of example, a device may be directed to a broad spectrum, but portions thereof may be directed to a narrower spectrum, and the spectral range of interest is thus limited to the range of interest for that portion of the device. By way of example a television may occupy a display portion, and additional emissions such as audio outputs. The spectral range of interest of the display may only extend to the visible range, even if the device as a whole includes the aural range as well, the aural range does not fall within the spectral range of the display used in the television. It is seen therefore that the application at hand determines the spectral range of interest, and that a spectral range of interest may differ by application, an apparatus, or a portion thereof. Regarding lateral waveguides, yet another aspect described below, each waveguide may have its own spectrum of interest, which may differ from the spectral range of interest of an adjacent waveguide.

Therefore, the spectral range of interest, equivalently referred to as the spectrum of interest, is defined herein as relating to any portion or portions of the total available spectrum of frequencies which is being utilized by the application, apparatus, and/or portion thereof, at hand, and which is desired to be detected and/or emitted utilizing the technologies, apparatuses, and/or methods of the invention(s) described herein, or their equivalents.

The term spectral component will relate to a portion of the energy at the aperture, which is characterized by its frequency, polarization, phase, flux, intensity, incidence, radiosity, energy density, radiance, or a combination thereof.

Waveguides are a known structure for trapping and guiding electromagnetic energy along a predetermined path. An efficient waveguide may be formed by locating a layer of dielectric or semiconducting material between cladding layers on opposite sides thereof. The cladding may comprise dielectric material or conductors, commonly metal. Waveguides have a cutoff frequency, which is dictated by the wave propagation velocity in the waveguide materials, and the waveguide width. As the frequency of the energy propagating in the waveguide approaches the cutoff frequency $F_c$, the energy propagation speed along the waveguide is slowed down. The energy propagation of a wave along a waveguide may be considered as having an angle relative to cladding. This angle is determined by the relationship between the wavelength of the wave and the waveguide width in the dimension in which the wave is being guided. If the width of the waveguide equals one half of the wave wavelength, the wave reaches resonance, and the energy propagation along the waveguide propagation axis stops. Two dimensional and three dimensional waveguides are well understood and their behavior is commonly modeled using mathematical models.

A Continuous Resonant Trap Refractor (CRTR) is a novel structure which is utilized in many aspects of the present invention, and as such, a simple explanation of the principles behind its operation is appropriate at this early stage in these specifications, while further features are disclosed below. A CRTR is a structure based on a waveguide having a tapered core, the core having a wide base face forming an aperture, and a narrower tip. The core is surrounded at least partially by a cladding which is transmissive of radiant energy under certain conditions. The CRTR may be operated in splitter mode and in a mixer/combiner mode. In splitter mode the radiant energy wave is admitted into the CRTR via the aperture, and travels along the depth direction extending between the aperture and the tip. The depth increases from the aperture towards the tip, such that larger depth implies greater distance from the aperture. Due to the core taper, when multi-frequency radiant energy is admitted through the CRTR aperture, lower frequency waves will reach cladding penetration state before higher frequency waves, and will penetrate the cladding and exit the waveguide at a shallower depth than at least one higher frequency wave. As waves of differing frequencies will be emitted via the cladding at differing depths, the CRTR will provide spatially separated spectrum along its cladding. Conversely, when operated in mixer/combiner mode, a wave coupled to the core via the cladding, at or slightly above a depth where it would have reached CPS in splitter mode, will travel from the emission depth towards the aperture, and different frequencies coupled through the cladding will be mixed and emitted through the aperture. Coupling light into the CRTR core from the cladding, will be related as 'injecting' or 'inserting' energy into the CRTR.

The depth at which the wave would couple into the tapered core is somewhat imprecise, as at the exact depth of CPS the wave may not couple best into the core, thus the term 'slightly above' as referred to the coupling of light into the tapered core in combiner/mixer mode should be construed as the depth at which energy injected into tapered core via the cladding would best couple thereto to be emitted via the aperture, within certain tolerances stemming from manufacture considerations, precision, engineering choices and the like.

Tapered waveguide directed at trapping radiant energy, as opposed to emitting energy via the cladding, have been disclosed by Min Seok Jang and Harry Atwater in "Plasmionic Rainbow Trapping Structures for Light localization and Spectrum Splitting" (Physical Review Letters, RPL 107, 207401 (2011), 11 Nov. 2011, American Physical Society©). The article "Visible-band dispersion by a tapered air-core Bragg waveguide", (B. Drobot, A. Melnyk, M. Zhang, T. W. Allen, and R. G. DeCorby, 8 Oct. 2012/Vol. 20, No. 21/OPTICS EXPRESS 23906, ©2012 Optical Society of America "Visible-band dispersion by a tapered air-core Bragg waveguide" B. Drobot, A. Melnyk, M. Zhang, T. W. Allen, and R. G. DeCorby, 8 Oct. 2012/Vol. 20, No. 21/OPTICS EXPRESS 23906, ©2012 Optical Society of America) describes out-coupling of visible band light from a tapered hollow waveguide with TiO2/SiO2 Bragg mirrors. The mirrors exhibit an omnidirectional band for TE-polarized modes in the ~490 to 570 nm wavelength range, resulting in near-vertical radiation at mode cutoff positions. Since cutoff is wavelength-dependent, white light is spatially dispersed by the taper. These tapers can potentially form the basis for compact micro-spectrometers in lab-on-a-chip and optofluidic micro-systems. Notably, Bragg mirrors are very frequency selective, complex to manufacture, and require at least a width higher than ¾ wavelength to provide any breadth of spectrum. In addition to the very narrow band, the Bragg mirrors dictate a narrow bandwidth with specific polarization, while providing however a fine spectral resolution.

UV radiation ranges between the visible light and higher frequency electromagnetic energy, such as X-Rays and gamma rays. While large amounts of UV energy are absorbed in the atmosphere, this radiation may still be of interest for harvesting above about 300 nm. For many applications and embodiments, the spectral range of interest may occupy only a portion of the available spectrum.

At sufficiently high frequencies, radiant energy is also commonly considered as a flow of photons, which are quantized units of energy which increases with frequency. Under this quantum physics description, the energy density associated with electric and magnetic fields are probability distributions of photons. Therefore certain terms that are common to simple electromagnetic energy can be better clarified as relating to the spectrum of interest. Thus, a dielectric material in the above mentioned energy spectrum of interest relates to a material having low conductivity, and having a band-gap between a filled valence band and an empty conduction band exceeding the energy of any photon in the spectrum of interest to a specific application. A "semiconductor" refers to a photovoltaicly active material, having a bandgap comparable to or smaller than the photon energy of any photon in the spectrum of interest to a specific application.

In contrast, a transparent conductor is a material having a finite but meaningful conductivity due to a partially filled conduction band or partially empty valence band but having a band-gap between the valence band and conduction band exceeding the energy of any photon in the spectrum of interest. These materials act like a dielectric at high frequencies but act like a conductor at low frequencies. Transparent dielectric materials also have low optical losses such that photons efficiently transmit through such material, at least at the spectrum of interest or a significant portion thereof.

While transparent conductors may be considered as wide bandgap semiconducting materials, they are used as conductors in most applications. Dielectrics, transparent conductors, and semiconductors, as used in these specifications, refer to materials that have a dielectric constant at optical frequencies; however the distinction between a semiconductor and the remaining materials is that the bandgap of a semiconductor is not substantially larger than the photon energy. As a general and non-limiting guideline, table 1 describes several characteristics of the different conductive, insulating, and semi-conductive materials.

TABLE I

| Material | Metal | Tramsparent Conductor | Semi-conductor | Dielectric |
|---|---|---|---|---|
| Bandgap | → 0 | >>photon | ≤photon | >>photon |
| DC Conductivity | high | good | Varies | → 0 |
| Optical Property | reflective | transparent | absorptive | transparent |
| Dielectric constant | complex | low loss | lossy | low loss |

In these specifications, the term cladding penetration state relates to a condition where energy confined by a tapered core waveguide leaves the waveguide via the cladding. Generally each waveguide has some negligible penetration of energy of energy into the cladding, however cladding penetration state occurs when a significant amount of energy is transported through the cladding. Cladding penetration state is generally frequency related, and energy of one frequency may reach cladding penetration state at a different set of conditions than the cladding penetration state of another frequency. By way of non-limiting example, if 66% of the energy of frequencies between F1 and F2 will exit a hypothetical waveguide via the cladding at a distance between 1 um to 2 um from the waveguide aperture, the cladding penetration state for F1-F2 would exist between 1-2 um from the aperture. Other frequencies may or may not overlap such range partially or completely. Notably the number 66% has been arbitrarily selected by way of example only, and may be modified as an engineering choice according to the application at hand.

In these specifications, cladding penetration state is used primarily to define a location or a region where cladding penetration would occur, rather than necessarily the actual occurrence of cladding penetration.

Stationary resonance condition is a condition in a waveguide where the local cutoff frequency of the waveguide equals the frequency of a wave guided by the waveguide, such that the guided wave reflects repeatedly between opposing surfaces of the guide, however the corresponding component of energy velocity along the waveguide propagation axis is zero. As the wave frequency approaches the local cutoff frequency of the waveguide, a sharp decrease in the wave propagation (group) velocity is noticed at the immediate vicinity of the cutoff dimension, as may be seen by way of example in the lower graph of FIG. 3. While complete stationary resonance condition is seldom if ever achievable, for the purpose of these specifications a stationary resonance (SRC) condition will be considered a situation where the guided wave is sufficiently close to the complete stationary resonance condition to significantly lower than the speed of light in the bulk material of the waveguide. Stated differently, when a wave falls within the zone of the sharp decrease in velocity it is considered to be in SRC.

With proper selection of cladding material and dimensions, energy will reach a cladding penetration state and depart the waveguide through the cladding at this stationary resonant condition. This mechanism is related to by the acronym CPS-SRC. CPS-SRC often occurs with reflective cladding, comprising thin metallic cladding. Notably a metallic cladding of lower thickness than the penetration depth to which the cladding is locally exposed would allow energy to pass therethrough and such cladding may be utilized. Furthermore, when certain metals are disposed at low thicknesses they tend to "ball-up" and form small "islands". Such "balled-up" metal, and/or intentionally perforated metal cladding may also form a discontinuous metal film cladding in a reflective CRTR waveguide.

Total internal reflection (TIR) is a phenomenon which occurs when a guided wave hits the boundary between the core and the cladding below a certain angle relative to the local propagation axis of the waveguide. The angle is known as the critical angel of total Internal Reflection. When a guided wave reaches or exceeds the critical angle it departs the waveguide via the cladding under normal refraction. Slightly below this critical angle the internal reflection by a finite cladding becomes incomplete in a process known as Frustrated Total internal Reflection (FTIR). This condition occurs mostly with dielectric cladding, but metallic claddings with small perforations or with thicknesses at or near the tunnel distance also have angle dependent reflection coefficients, resulting in a situation analogous to FTIR. Cladding penetration condition reached by a wave exceeding the critical angle of total internal reflection is referred to hereinafter as CPS-FTIR. Both CPS-FTIR and CPS-SRC are characterized by energy traversing the cladding, thus CPS, or 'cladding penetration state' will be used interchangeably to denote CPS occurring through any mechanism.

Structure to facilitate conversion of radiant energy to electricity or electrical signals (hereinafter "LE"), or conversion of electrical signals into radiant energy such as light (hereinafter "EL") are known. Collectively, objects, materials, and structures, which perform conversion between two forms of energy, or adjust and control flow of energy, are known by various names which denote equivalent structures, such as converters, transducers, absorbers, detectors, sensors, and the like. To increase clarity, such structures will be referred to hereinunder as 'transducers'. By way of non-limiting examples, the term "transducer" relates to light sources, light emitters, light modulators, light reflectors, laser sources, light sensors, photovoltaic materials including organic and inorganic transducers, quantum dots, CCD and CMOS structures, LEDs, OLEDs, LCDs, receiving and/or transmitting antennas and/or rectennas, phototransistors photodiodes, diodes, electroluminescent devices, fluorescent devices, gas discharge devices, electrochemical transducers, and the like.

A transducer of special construction is the RL transducer, which is a reflective transducer. Reflective transducers controllably reflect radiant energy. Such transducers may comprise micro-mirrors, light gates, LCD, and the like, positioned to selectively block the passage of radiant energy, and reflect it into a predetermined path, which is often but not always, the general direction the energy arrived from. Certain arrangements of semiconductor and magnetic arrangements may act as RL transducers by virtue of imparting changes in propagation direction of the radiant energy, and thus magnetic forces or electrical fields may bend a radiant frequency beam to the point that in effect, it may be considered as reflected. RL transducers may be fixed, or may be used to modulate the energy direction over time.

The skilled in the art would recognize that certain LE transducers may act as EL transducers, and vice versa, with proper material selection, so a single transducer may operate both as EL and LE transducer, depending on the manner of operation. Even certain RL transducers may act as another transducer type. Alternatively transducers may be built to operate only as LE, as RL, or as EL transducers. Furthermore, different types of transducers may be employed in any desired combination, so the term transducers may imply any combinations of LE, EL, and RL, as required by the application at hand.

Solar energy converters have been extensively researched and many attempts were made to achieve an efficient structure for performing solar energy to electric energy conversion. Presently the most common devices for achieving such conversion are photovoltaic (PV) solar cells which generally use layers of different materials forming a PN junction at their interface. When exposed to a photon having energy equaling or higher than the band gap between the junction materials, the photon energy causes formation of electron-hole groups, which are separated and collected on both sides of the junction. Several technologies exist to increase efficiency in the PV transducer, such as multi-layered junctions, quantum dots, and the like.

Yet another class of transducers employs polymer based photoabsorptive material as electron donors in combination with electron acceptors. In some cases the resulting excited electron is separated from the corresponding hole using different work function conductors. In other cases, a polymer electron acceptor forms a heterojunctions with the electron donor. Such transducers generally have lower efficiency; however their efficiency may be significantly advanced by aspects of the present invention.

Other types of transducers utilize antennas, and more commonly rectennas, to achieve the energy conversion. The term rectenna relates to an antenna structure having a rectifier integrated with, or closely coupled to, the antenna, such that electromagnetic energy incident on the antenna is rectified and presented as primarily unidirectional (ideally DC) signal. By way of example, rectennas are described in U.S. Pat. No. 7,799,998 to Cutler, and in "Nanoscale Devices for Rectification of High Frequency Radiation from the Infrared through the Visible: A New Approach", N. M. Miskovsky, P. H. Cutler, A. Mayer, B. L. Weiss, Brian Willis, T. E. Sullivan, and P. B. Lerner, Journal of Nanotechnology, Volume 2012, Article ID 512379, doi:10.1155/2012/512379, Hindawi Publishing Corporation©.

Current radiant energy detectors typically employ normal incidence of radiant electromagnetic energy onto a detector structure. Normal incidence has the limitation of a finite probability of detecting energy before it is transmitted through the collection layer. Energy transmitted through the collection layer is, at best, lost and, at worst, converted to heat in the supporting substrate. Several attempts has been made to provide transducers that use 'side illumination' in which the energy is inserted from the side of the junction. Such examples include, inter-alia, U.S. Pat. No. 3,422,527 to Gault, U.S. Pat. No. 3,433,677 to Robinson, and U.S. Pat. No. 4,332,973 to Sater.

Radiant energy transducers also typically employ a broad-band collector. Photovoltaic transducers are high pass collectors in that all energy above a critical cutoff frequency is converted. However, the photon energy in excess of the band gap energy is converted to heat. Rectenna transducers attempt to employ broad-band antennas with rectifiers. Their operating frequency is limited by the characteristics of the rectifier and by the bandwidth of the antenna. However, transducers generally exhibit a frequency dependent optimum efficiency, which is commonly also affected by temperature.

Stacking transducer layers of the same bandgap or of differing bandgap has been attempted and has been shown to improve efficiency. Detecting higher frequency signals in a first, higher bandgap material and transmitting lower frequency waves with photon energy below the material bandgap allows their subsequent conversion in lower bandgap materials. However, as each layer is of finite thickness, the transmitted signal losses are significant. Quantum dots are also frequency sensitive, and the technology offers a relatively easy tuning of the transducer to a specific band, and an ability to combine several frequency optimums with relative ease.

Radiant energy transducers typically employ normal incidence of radiant electromagnetic energy onto a detection structure. Normal incidence has the limitation of a finite probability of detecting energy before it is transmitted through the collection layer. Energy transmitted through the collection layer is, at best, lost and, at worst, converted to heat in the supporting substrate.

Prisms and other refractive devices can be used to improve incidence angles, and to direct different frequencies of radiant energy to different regions of a detector, where each region is optimized for a target frequency. U.S. Pat. No. 7,888,589 to Mastromattteo and U.S. Pat. No. 8,188,366 to Hecht, disclose examples of such devices. Different arrangements of concentrators are also known, which are operative to concentrate energy to transducers. U.S. Pat. No. 5,578,140 to Yogev et al. as well as Hecht provide examples to such arrangements. Those methods require significantly increased device area, and reduce the total energy per unit area (and per unit manufacturing cost) in exchange for increased efficiency.

Vertical optical waveguides are known in the art. U.S. Pat. No. 4,251,679 to Zwan depicts a plurality of transducing cavities having an inwardly inclined wall to receive impinging radiation. Two potential barrier strips each having different conduction electron densities; each potential barrier strip is connected to a conductor having a preselected conduction electron density whereby radiation impinging on a cavity will induce current flow which will be rectified across the potential barriers. U.S. Pat. No. 3,310,439 to Seney relates to embedding spaced dimensioned crystals into p-n semiconductor layers of a solar cell device. The crystals function as waveguides into the photovoltaic layer.

Waveguides, as well as different combinations of concentrators, mirrors, lenses, and other refractive devices have been used in different combination to increase the utility of various types of radiant energy transducers. However the existing solutions are either expensive, heavy or utilize large surface area relative to the usable transducer area. Furthermore, the above attempts are designed to have the radiant energy ideally impinges on the transducer at normal incidence angle for optimal efficiency.

The patents, patent applications, articles, and other publications disclosed above are incorporated herein by reference in their entirety.

There is therefore a clear, and heretofore unanswered, need for better technology, devices, and methods of manufacturer of energy conversion cells, which will solve the shortcomings of the known art, both for displays, and for energy conversion devices.

SUMMARY OF THE INVENTION

It is therefore an object of the invention to provide a device and technology to increase the energy efficiency of a radiant energy conversion cells which is relatively inexpensive, easy to manufacture, and which does not significantly increase the surface dimensions or weight of the cell so as to adversely effect its usability. It is also an object of the present invention to provide and relatively inexpensive display panels.

In one aspect of the invention these goals are met by providing an optical splitter which utilizes a tapered core waveguide to form a continuous resonant trap refractor (CRTR). In simplified terms, energy enters the CRTR at the aperture. The energy is sorted by its frequency, where higher frequencies are radiated farther from the inlet, at or near a resonant trapped condition. The sorted energy is then outputted from the sides of the CRTR. A plurality of transducers, each optimized to have maximum efficiency at a specific frequency, is arranged in the path of energy penetrating the CRTR cladding, such that each transducer receives energy at or near its frequency of optimum efficiency. In some embodiments, the transducers are waveguide based transducers.

To that end there is provided a radiant energy to electrical energy conversion cell comprising a plurality of spectral splitters, for spatially separating multi-frequency radiant energy into at least two spectral component thereof, the spectral slitters comprising: a waveguide having a tapered core, the core having a first end and a second end, the first end defining an aperture, the core having a depth direction extending between the first end and the second end, wherein the depth magnitude increases with distance from the first end towards the second end. The core has a width dimension in at least one direction substantially transverse to the depth direction. The core width monotonically decreasing in magnitude as a function of the depth. A cladding is disposed at least partially around the core; wherein the aperture of the core is dimensioned to allow passage of radiant energy comprising at least a first and a second spectral components each having a frequency associated therewith. The first spectral component has a lower frequency than the second spectral component. The varying width of the core resulting in the first and the second spectral components reaching a cladding penetration state, at which they will penetrate the cladding at a respective first and second depths, wherein the first depth is less than the second depth. The conversion cell further comprises at least a first and a second energy transducers, disposed such that the first spectral component impinges on the first transducer, and the second spectral component disposed such that the second spectral component will impinge on the second transducer.

furthermore, there is provided an energy converter for converting multi-frequency radiant energy into electrical energy, the converter comprising a plurality of superposed waveguides, at least a first and a second of the superposed waveguide having energy transducers disposed within. Each of the at least two waveguides having an inlet and comprising a core having a photoactive conversion zone for converting radiant energy entered via the inlet into electrical energy; the core being disposed between charge collectors for collecting electrical energy from the conversion zone, and a cladding disposed about the optical core. Each of the at least two waveguides is constructed to guide incoming energy in a direction generally paralleling the interface between the cladding. The converter further comprises a plurality of spectral refractors, at least one of which comprising a tapered waveguide core having a first end and a second end, the first end defining an aperture, the core having a depth direction extending between the first end and the second end. The depth magnitude increases with distance from the first end towards the second end. The tapered core having a width dimension in at least one direction transverse to the depth direction. The tapered core width monotonically decreasing in magnitude as a function of the depth. A cladding is disposed at least partially about the tapered core, wherein the first end of the tapered core is dimensioned to allow passage of radiant energy comprising at least a first and a second spectral components each having at least one frequency associated therewith, wherein the first spectral component has a lower frequency than the second spectral component The varying width of the tapered core will cause the first and the second spectral components reaching a state at which they will penetrate the cladding and be emitted from the spectral refractor at a respective first and second depths, wherein the first depth is less than the second depth. The plurality of spectral refractors are disposed within the superposed waveguides such that the first spectral component will couple into the input of the first of the plurality of superposed waveguides, and the second spectral component will couple into the input of the second of the plurality of the superposed waveguides.

The structure described above resulting in energy admitted into the CRTR aperture being sorted according to its frequency, and spectral components thereof being emitted via the cladding in frequency sorted fashion corresponding to the depth. This occurs because the tapered core is dimensioned so that each of two spectral components will reach a critical width at which it will penetrate the cladding. The emitted spectral components are coupled to differing superposed lateral waveguides resulting in different waveguides within the lateral waveguide stack receiving different frequency bands. Optionally, the charge collectors of at least one of the superposed waveguides are also the cladding therefor, such cladding optionally comprises metal. Optionally, the transducer disposed within the first superposed waveguide is optimized to at least one frequency in the first spectral component, and the transducer disposed within the second superposed waveguide is optimized to at least one frequency in the second spectral component. Stated differently, optionally the transducers disposed within the lateral waveguide stack are each optimized for the frequency band which the individual waveguide receives, or at least to a portion thereof.

The transducers of each of the lateral waveguides may differ from other transducers, and transducers may be selected from a group consisting of an inorganic photovoltaic converter, an organic photovoltaic converter, a quantum-dot-based converter, an electrochemical radiant energy converter, a thermoelectric energy converter, rectenna based converter' antenna based converter, and any combination thereof.

Optionally the cladding disposed about the tapered core comprises continuous or discontinuous metal. At least in case of metal clad tapered core, the thickness of the cladding disposed about the tapered core is in the order of, or thinner than, the penetration depth for at least one frequency, at or about the depth corresponding to the cladding penetration state of the at least one frequency. Stated differently, in embodiments using the option of a metal cladding about the tapered core, preferably the local thickness of the cladding is no thicker than the penetration depth of the frequency which locally penetrates the cladding, which may be referred to as the local frequency.

The term "about the cladding" or equivalently about the CRTR or its core, and their equivalents, should be construed to mean being coupled to via energy path, which implies that the transducer is disposed about the cladding not only by being physically adjacent to the cladding, but also when an energy path such as beam propagation, waveguide, and the like, exists between the location where energy is transferred in or out of the cladding, and the transducer. Similarly, the disposition about the cladding is set by the location at which the energy exists or enters the cladding. Thus, by way of example if the transducer is coupled to the cladding via a waveguide such that the energy couples at depth A of the CRTR, the transducer is considered to be disposed at depth A regardless of its physical location relative to the RCTR.

In other embodiments, the cladding disposed about the tapered core comprises a dielectric material, or a composition thereof. Preferably, the local thickness of the cladding is smaller that % of the wavelength of the local frequency, and oftentimes a far thinner cladding is desired, such as one half or one quarter of the local frequency, or thinner.

Optionally the tapered core is in the form of an elongated wedge.

In certain embodiments, the superposed waveguides are planar and the superposed waveguide stack has an edge, and at least two of the charge collectors are electrically coupled to contact regions near the edge. This allows connection of the transducers via the edge.

In some embodiments the second end of the tapered core allows passage of a portion of energy admitted via the aperture, and in some embodiments the second end blocks such passage. Optionally the converter may comprise a reflector disposed at or near the second end, operational for reflecting a portion of the energy admitted via the aperture. In other embodiments the second end comprises a transducer for harvesting energy which reaches the second end.

In another aspect of the invention, there is provided a switched capacitor combiner circuit for providing series-connected voltage output from a plurality of direct current (DC) sources, the combiner circuit comprises a plurality of capacitors, each having a first at least two terminals, each of the terminals being coupled to a corresponding switching device; the switching devices having a charge and a discharge state, wherein in the charge state the switching devices are operative to couple the respective capacitor in parallel to at least one respective DC sources, so as to transfer charge from the DC source to the capacitor; and wherein in the discharge state the switching devices operatively couple the plurality of capacitors in series, and further couple the series coupled capacitors to a load. Such combiner circuit allows at least two off the DC sources to have differing voltages.

The combiner circuit further comprising a controller to control the switching devices between the charge and the discharge state.

Optionally the DC sources are connected at opposing polarity to each other.

The DC sources may be a plurality of transducers as described above, such as transducers disposed within the superposed lateral waveguides. Optionally, at least one of the capacitors is formed between two adjacent charge carriers of two transducers. Stated differently, in some embodiments the charge carriers form plates which are parallel to each other with some dielectric disposed therebetween, the plates and dielectric form a capacitor which can be used as a switched capacitor for the combiner circuit, or as a portion of the capacitor. Several capacitors may be thus formed between the charge carriers of varying superposed waveguides.

Optionally, the combiner circuit or portions thereof are disposed in an edge connector coupleable to superposed waveguides.

SHORT DESCRIPTION OF DRAWINGS

The summary, above, and the following detailed description will be better understood in view of the enclosed drawings which depict details of preferred embodiments. It should however be noted that the invention is not limited to the precise arrangement shown in the drawings and that the drawings are provided merely as examples.

FIGS. 1a and 1b depict two-dimensional waveguide based transducers formed between two bounding layers.

FIG. 2 depicts a simplified diagram of equivalent plane waves propagating within a waveguide being identical to a waveguide mode.

Figure 7:
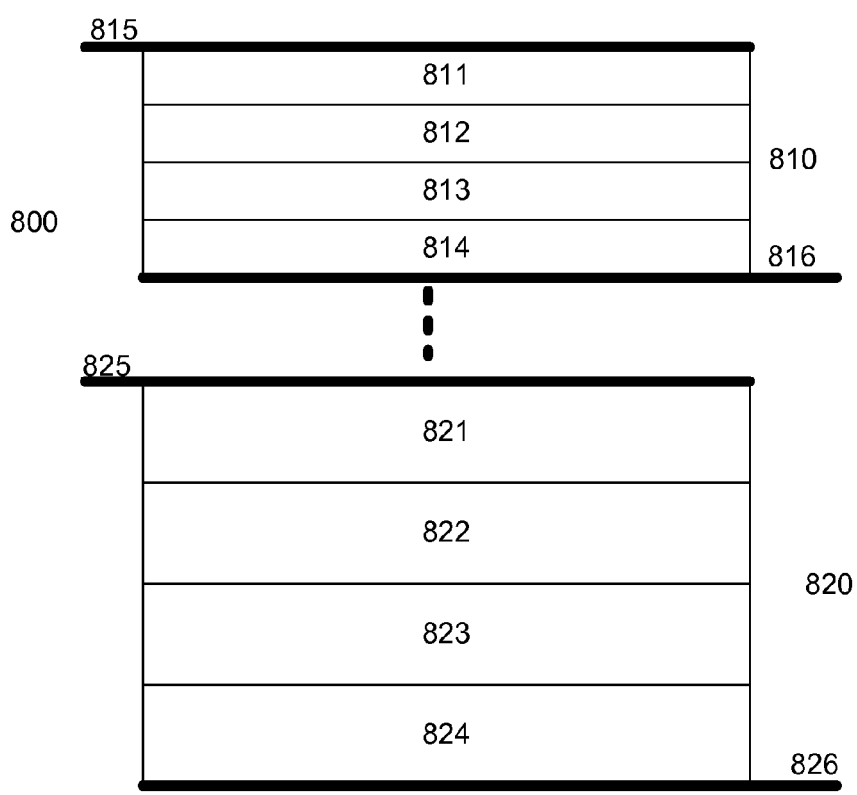

FIG. 7 provides examples of solid state semiconductor based transducers disposed in lateral waveguides.

Figure 8:
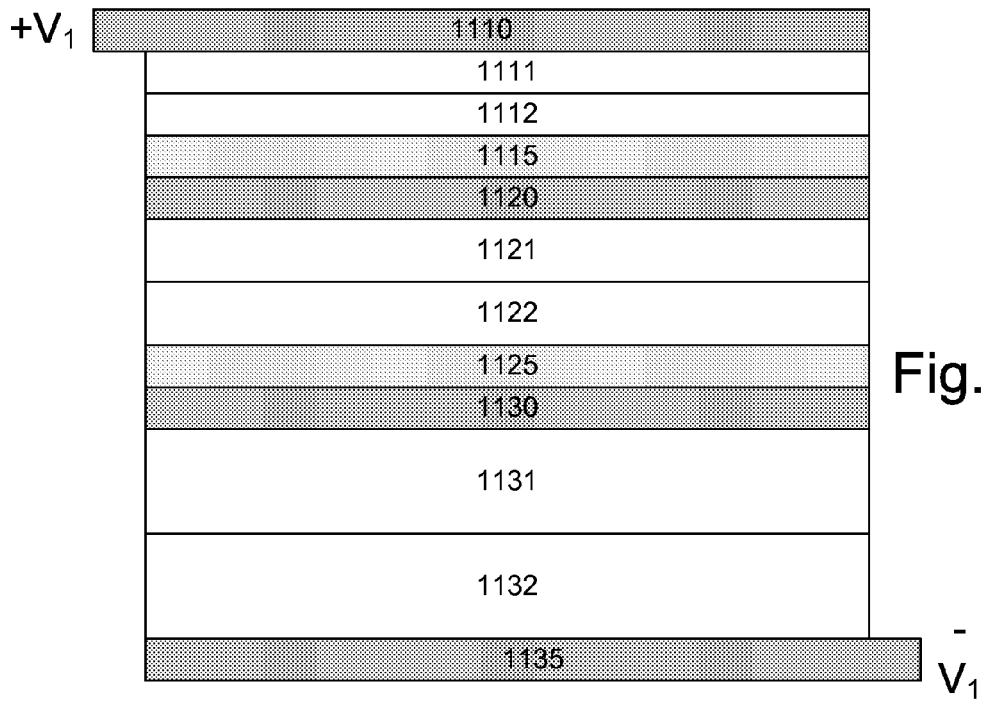

FIG. 8 depicts series connected stacked transducers.

Figure 9:
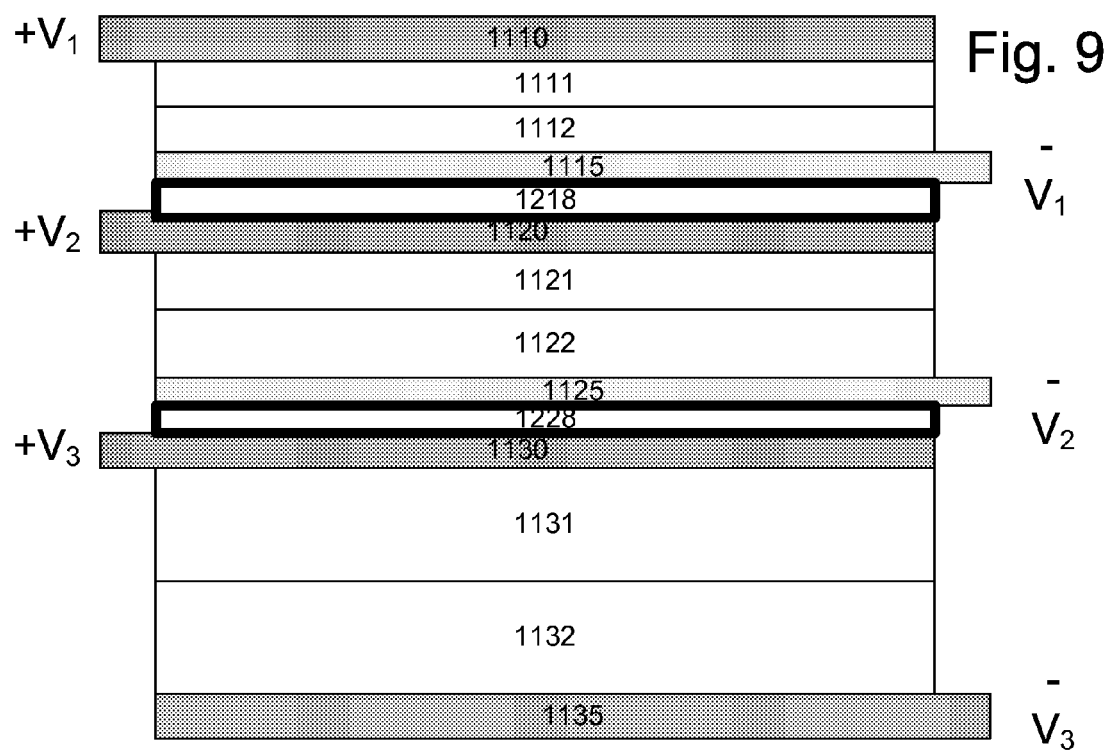

FIG. 9 depicts independently connected stacked transducers.

Figure 10:
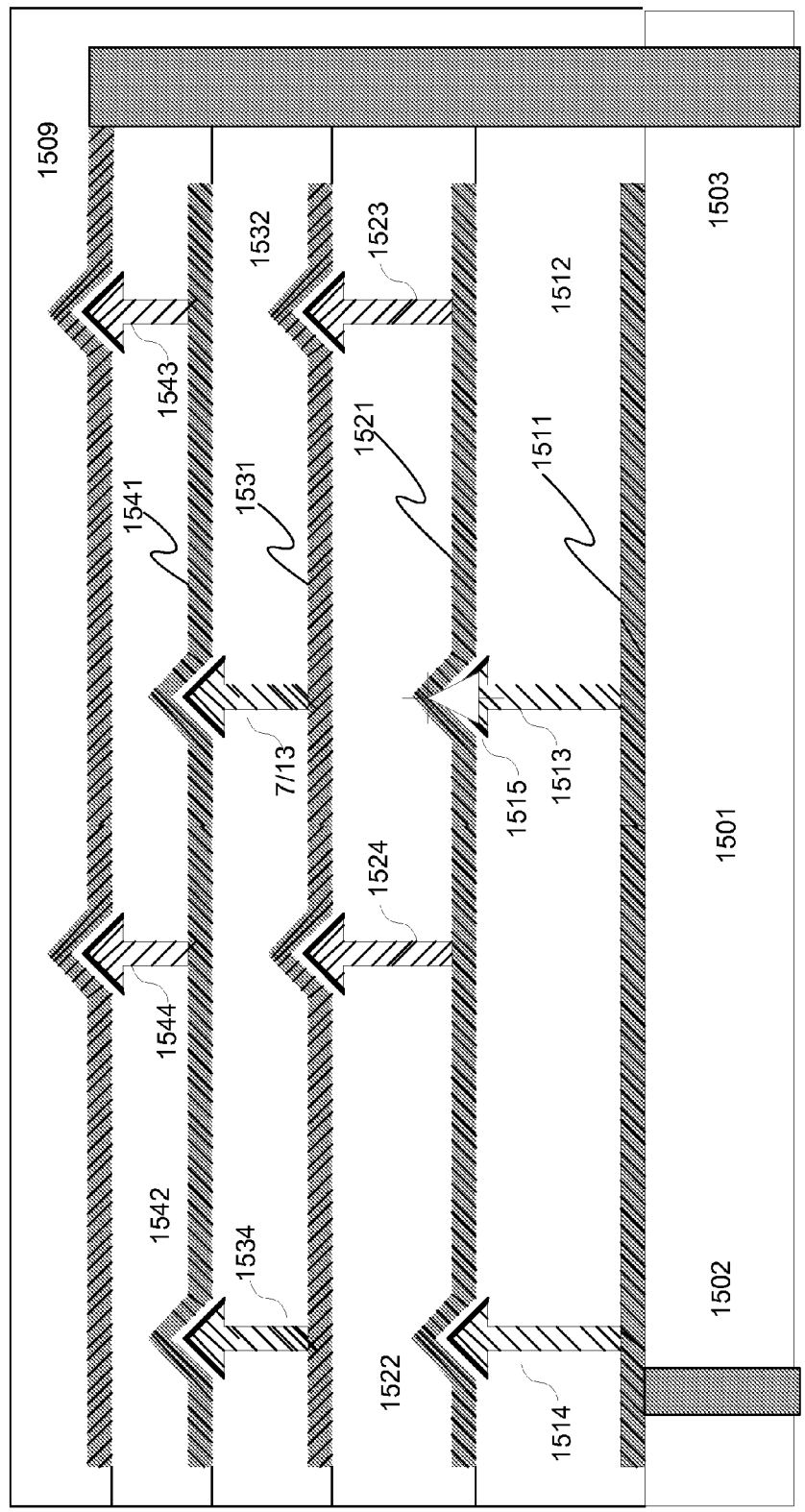

FIG. 10 depicts simplified rectenna based transducers.

Figure 11:
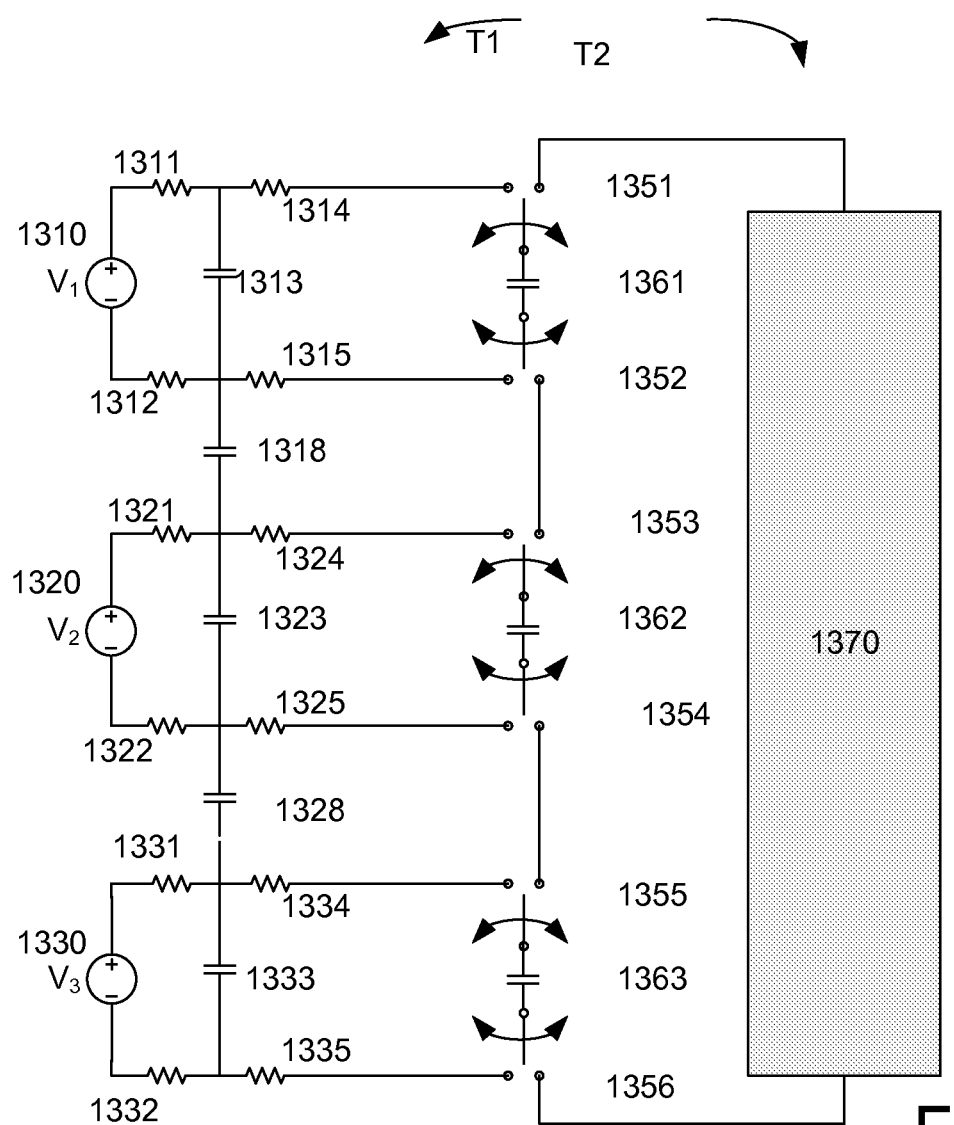

FIG. 11 depicts a simplified schematics of switched capacitor inverter/combiner circuit for providing series-connected voltage output from individually connected voltage sources.

Figure 12:
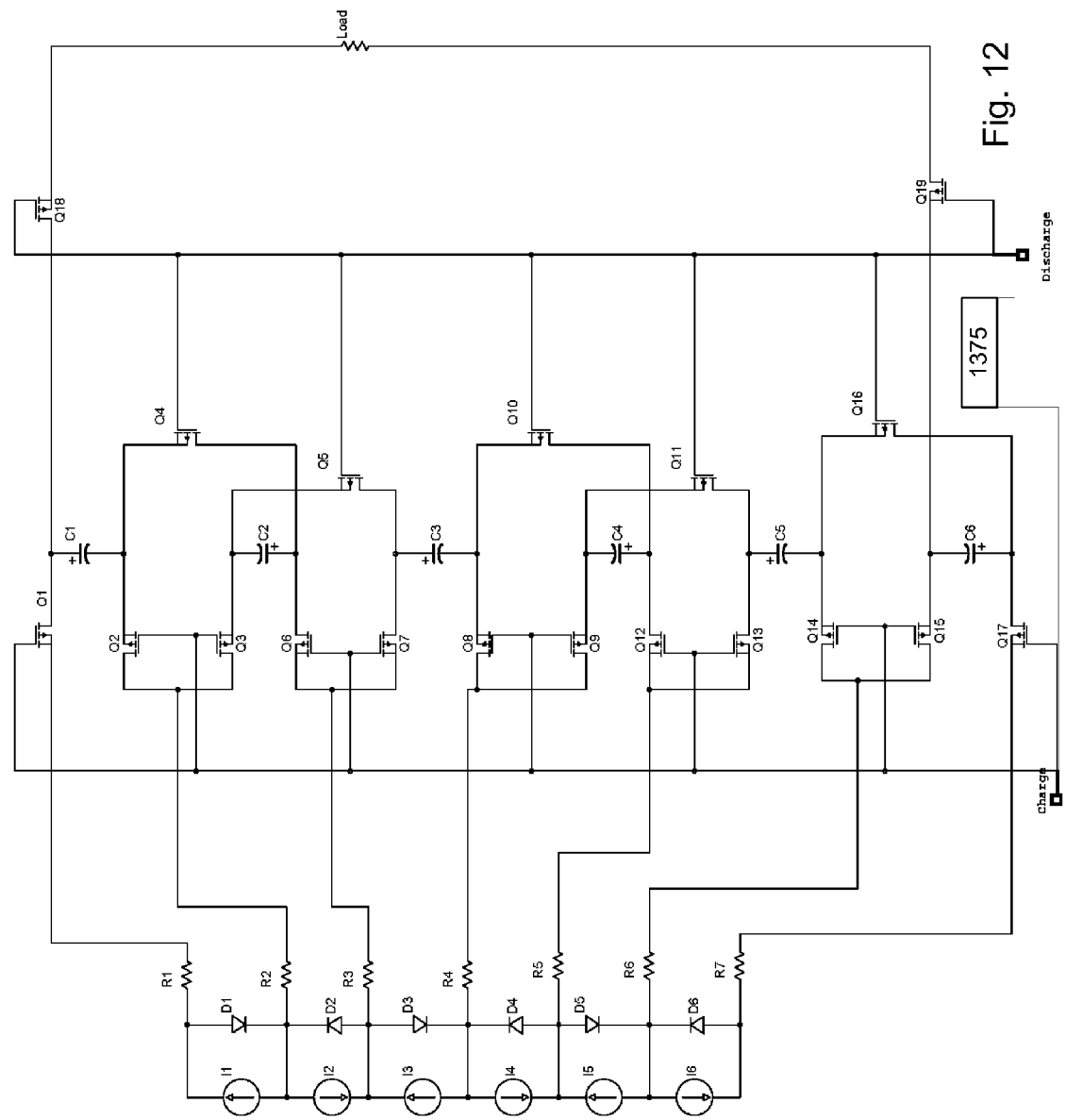

FIG. 12 depicts a more detailed, yet still simplified, schematic of switched capacitor inverter/combiner circuit.

Figure 13:
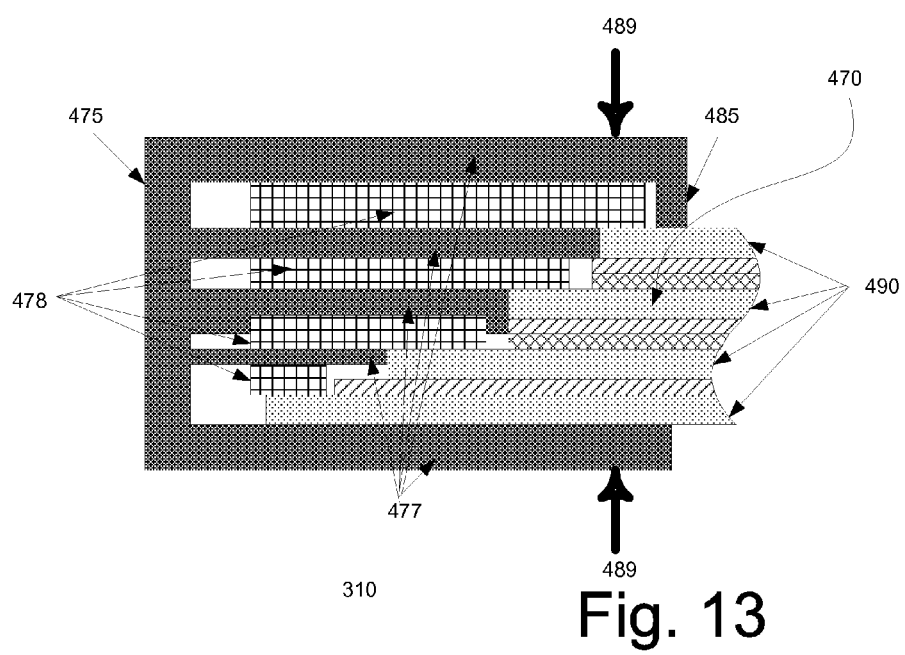

FIG. 13 depicts a cutaway view of the edge portion of a solar panel comprising lateral waveguides based transducers, and an edge connector therefor.

Figure 14:
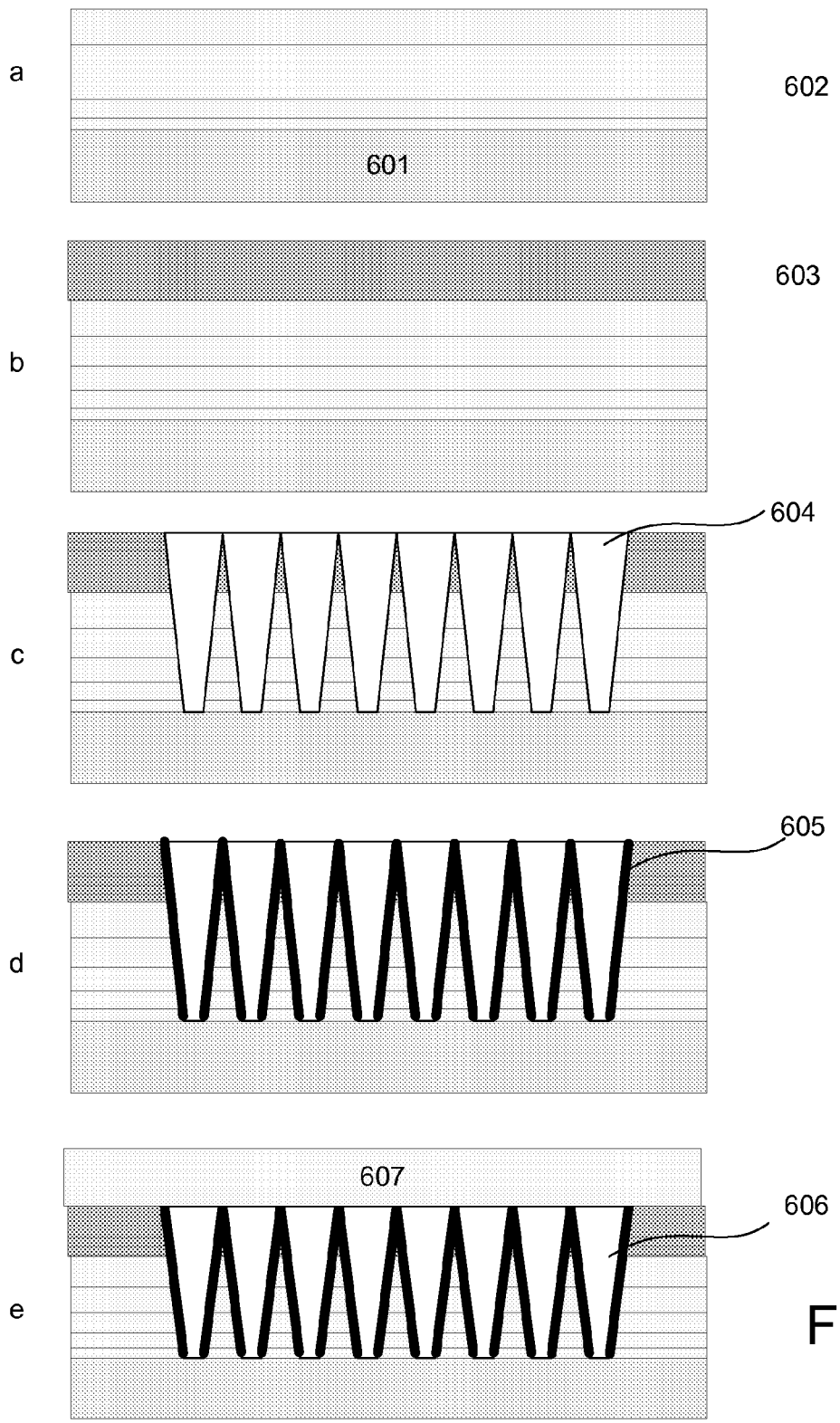

FIG. 14 depicts a method of manufacturing an array of CRTR into a set of stacked transducers by first disposing transducers onto an arbitrary substrate, then subtractively defining the locations and finally additively inserting the CRTR array.

Figure 15:
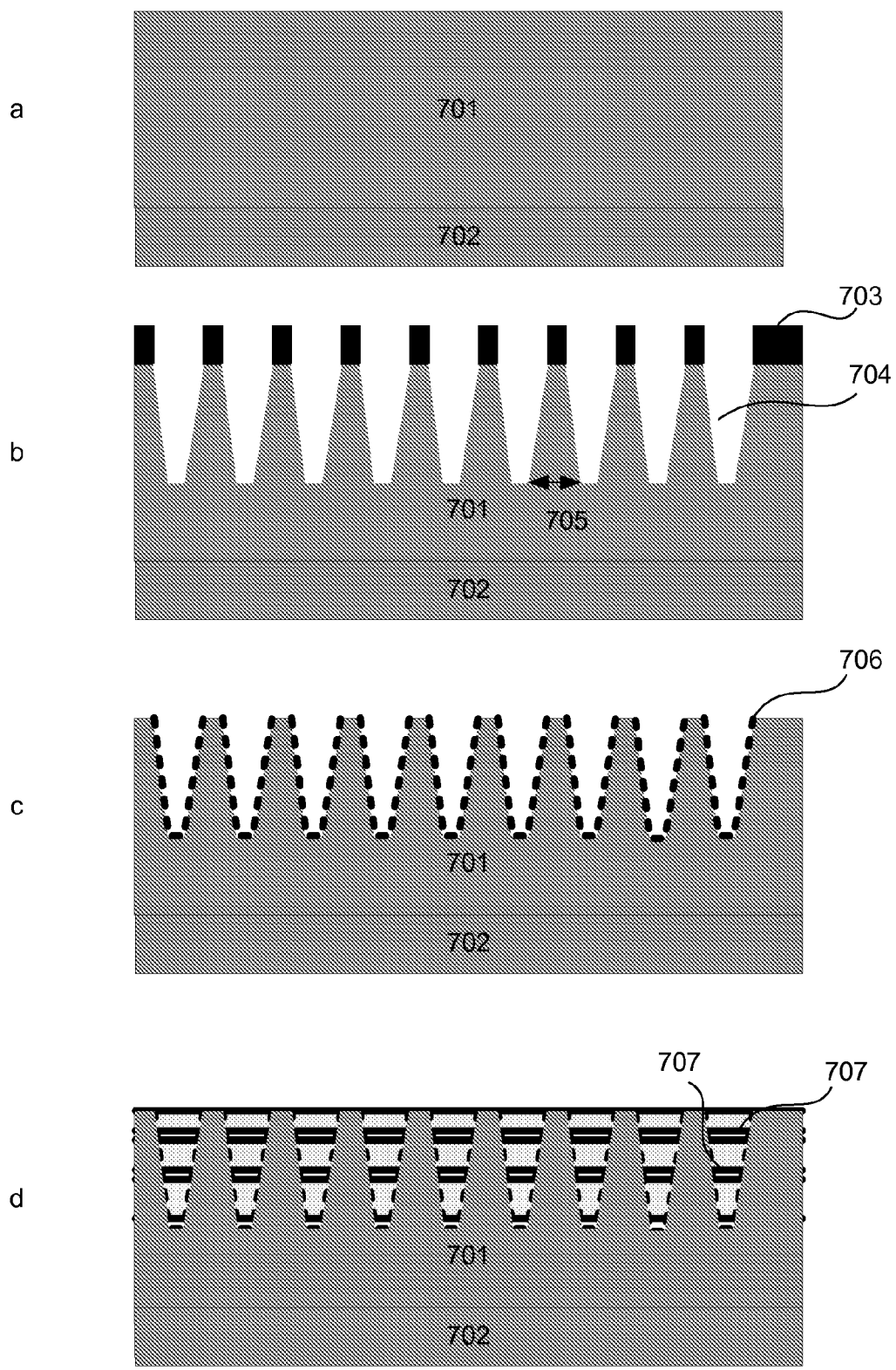

FIG. 15 depicts a method of disposing a set of stacked reflectors upon an array of CRTR after defining the CRTR by subtractive etch from an optical substrate.

DETAILED DESCRIPTION

Certain figures and embodiments of the invention will be described herein by way of example to increase the understanding of different aspects of the invention.

FIGS. 1a and 1b alternately depict a short region of waveguide with insignificant variation of thickness, and are provided for simple explanation of the propagation characteristics of radiant energy within such waveguides. For the purpose of explanation, FIGS. 1a and 1b may be considered to represent a cutout of a short region of the CRTR tapered core waveguide.

FIG. 1.a shows a two dimensional waveguide 100 comprising a waveguide core material 101 of thickness (width), h, formed between conductors 102 and 103. Optionally, the waveguide core material 101 could be replaced by a plurality of layers forming an aggregate optically equivalent to a uniform material having dielectric constant, E, and the same overall thickness. Such construction would be recognized as equivalent by the skilled artisan. In plurality of layers construction, the section 114 may be eliminated, and a waveguide based transducer is formed by the various layers shown. This is the construction suggested for many embodiments of the cell aspects of the invention.

A portion of such an aggregate waveguide core region forms a photovoltaic transducer comprising a p-type semiconducting region 104 and an n-type semiconducting region 105. Optional intrinsic region 106 therebetween may exist in some embodiments. Optional transparent conductor regions 107, 108 also exist in some embodiments. The purpose of optional transparent conductors 107, 108 is to provide a vertical electrical contact to overlying and underlying metal while allowing the waveguide height to be optimized for frequency while the semiconductor thickness is optimized for carrier collection efficiency.

Similarly the plurality of layers may comprise varying polymeric materials including dye sensitized semiconductor, photoabsorptive electron donor, electron acceptor, and transparent conductor regions as are known in the art.

Insertion of radiant energy perpendicular to the direction of photovoltaic current, provides short diffusion lengths from the photoabsorptive material to the junction, allowing efficient collection of charge carriers and minimizing recombinant losses. It also provides long optical paths for efficient photoabsorption and concentrates the photon flux close to the photoabsorptive region. In a p-n junction construction the perpendicular insertion direction increases efficiency by concentrating energy close the junction. Other efficiency benefits would be explained below.

Collectively regions 104-108 comprise an aggregate waveguiding region. Aggregate waveguiding regions may be considered to have an average relative dielectric constant, E. The average relative dielectric constant, E, determined using formula well known in the art and resulting in a speed of electromagnetic plane wave propagation in the bulk of the core material, $V_b = 300*10^6/\sqrt{E}$ meters per second. It is noted that $\sqrt{E}$ is the refractive index (commonly denoted as 'k' in semiconductor manufacture field, and as 'n' in the field of optics). In the depicted example, bounding layers 102, 103 are conductors, providing mirror reflection. This is especially desirable to maximize fill factor in the semiconductor transducers by reducing the series resistance of the transducer.

The cutoff frequency, FCN, of the Nth order mode is obtained as $$F_{CN} = NV_B/2h \text{ wherein } N \text{ is the mode order}$$

Below this cutoff frequency an electromagnetic wave cannot travel laterally along the waveguide X axis. At the critical frequency, a guided plane wave reflects repeatedly between the upper and lower conductors but makes no lateral progress along the waveguide. Above the cutoff frequency a wave travels with a dispersion equation $$\beta_N = 2\pi\sqrt{(F^2 - F_{CN}^2)}$$

Wherein βN is wavenumber of the Nth order mode, F being the wave frequency, and $F_{CN}$ is the cutoff frequency as described above.

The wave has N half-wavelengths of variation across the thickness, h, and propagates with a wavelength along the guide $\lambda_{GN} = 2\pi/\beta_N$.

Higher order modes have larger values of N and have higher cutoff frequencies for the same thickness waveguide.

An incident plane wave 110 at a low angle of incidence will couple best to the most uniform waveguide mode 111, so the fundamental mode is most readily coupled for incidence parallel to the waveguide.

Energy incident at an angle, $\theta_i$ 112, will be partially refracted 113 into the guide and partially reflected. The fraction of an incident wave admitted into the guide is determined by the integral of the incident wave front 110 with the mode shape 111. Narrow guides compared to the wavelength have a broader angular acceptance range, operate closer to their resonant condition, and have slower energy velocities.

FIG. 1.b shows a similar two dimensional waveguide based waveguide 150 comprising a dielectric material 151 of thickness, h, formed between dielectric cladding materials 152 and 153. Notably, transparent conductors will act in a similar fashion, and their use is also contemplated. In some embodiments the dielectric cladding materials may optionally be transparent conductors. In other embodiments it may be desirable to employ transparent conductors as part of the waveguide structure and to employ thinner regions of photovoltaicly active material within the waveguides. For example, low-k dielectric 152 could separate transparent conductor 108 from adjacent waveguide's transparent conductor 107b.

The critical frequency, $F_{CN}$, is obtained as $$F_{CN} = NV_B/2(h+\delta_N),$$

where $\delta_N$ (depicted schematically as the dimensions indicated by 162 and 163 at FIG. 1b) represents the effect of partial penetration of mode profile 161 into the neighboring dielectric regions, and h represents the thickness (width) of the core region. It is seen therefore that while the width at which a CPS occurs may differ, the qualitative properties are similar to those of the conductor clad waveguide based transducers. We note that if ON is comparable to the cladding layer thickness, FTIR energy leakage will occur and the waveguide will have a finite propagation loss. This may or may not be desirable depending on the mechanism employed for causing energy to penetrate the cladding.

FIG. 2 depicts a waveguide 200 with extents along y of ±h/2 and propagation along x. The waveguide supports a fundamental mode with cross-section amplitude distribution 201 and propagation wave along the waveguide with a frequency-dependent period 202. The wave may be written as $$A_{(X,Y)} = \cos\left(\pi\frac{y}{h}\right) * \exp(j\beta_N X - j2\pi F t)$$

The cosine is ½ the sum of two exponentials, representing upward 203 and downward 204 plane waves. The waves make an angle 205 with respect to the propagation direction 206, given as $$\theta = \cot^{-1}\sqrt{\left(\frac{F^2}{F_C^2} - 1\right)}$$

such that as frequency, F, approaches the cutoff frequency, $F_C$, the angle approaches 90°.

Figure 3:
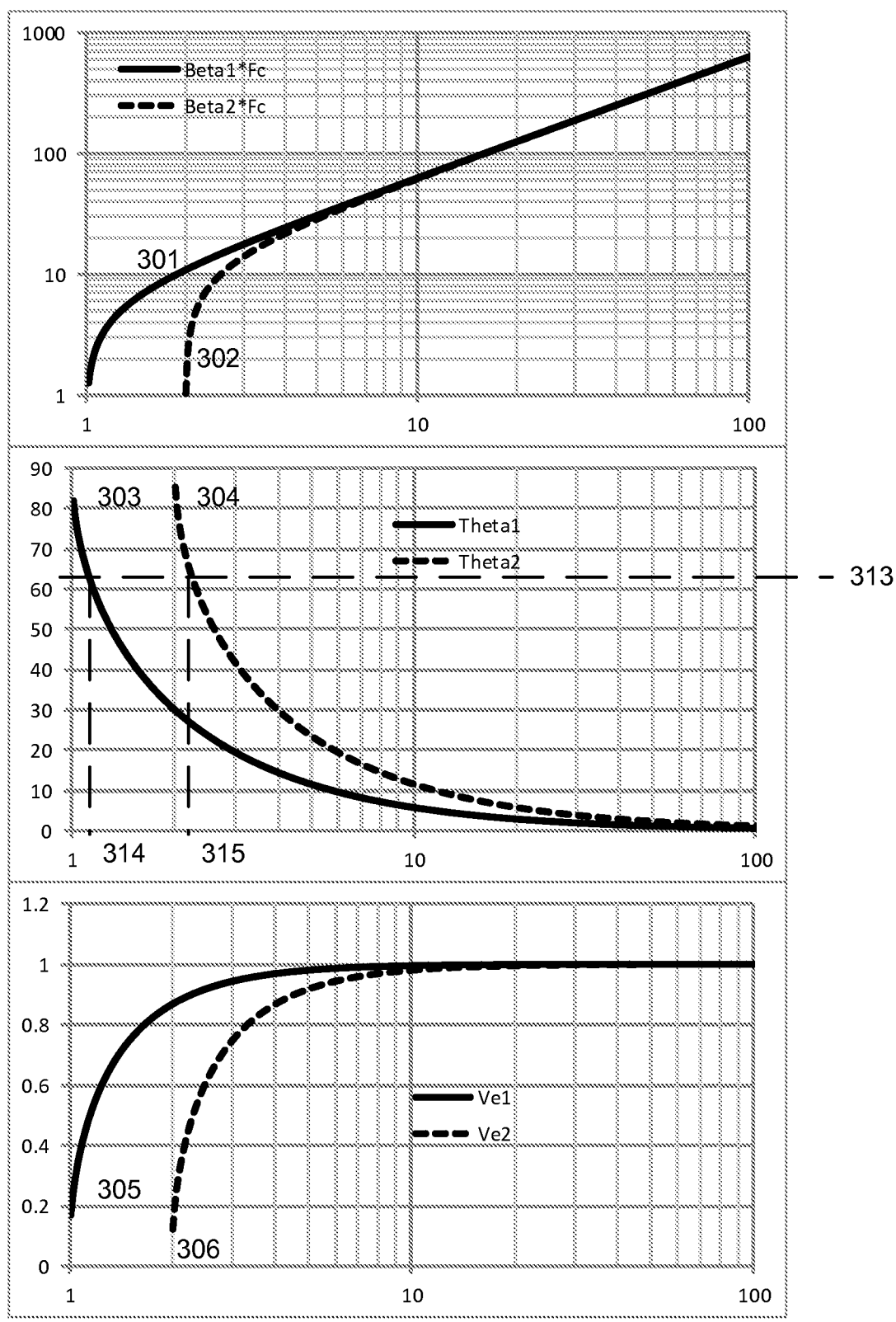
FIG. 3 depicts the wavenumber as a function of frequency, the ray angle as a function of frequency, and the energy velocity as a function of frequency for two modes of a waveguide.

FIG. 3 plots the wavenumbers, $\beta_1$ 301 and $\beta_2$ 302, having cutoff frequencies, $F_{C1}$ and $F_{C2}$ respectively, for a respective first and second mode of a waveguide of thickness, h, and dielectric constant, E. The frequency axis 307 is logarithmic and normalized to cutoff frequency $F_{C1}$. In the middle graph of FIG. 3, the angle of the equivalent plane waves from parallel are also shown for the first 303 and second 304 modes respectively. The angle of the equivalent plane waves from parallel is also shown for the first 303 and second 304 modes, the critical angle $\theta_C$ for total internal reflection 313 and the corresponding ratio of the critical frequency compared to cutoff for the first 314 and second 315 modes being shown for a dielectric-clad waveguide. In the bottom graph of FIG. 3 the energy (or group) velocity, $V_{E1}$ 305 and $V_{E2}$ 306 are shown normalized to the bulk speed of light in the material, $V_B$. As shown, the respective group velocity is zero at the cutoff frequencies and then rapidly approach $V_B$ at high frequencies. The area where the group velocity slows significantly relative to $V_B$ is easily distinguished.

A wave at high frequency relative to the waveguide's cutoff frequency will travel effectively at the speed of light in the bulk material $V_B$, with a very low angle relative to the propagation axis of the waveguide. Such a wave has a very shallow angle of incidence on the boundaries of the waveguide and is said to have grazing incidence. By way of example, a wave having a frequency about six times the cutoff frequency has an angle of incidence of about 10° and travels at effectively the speed of light in the waveguide core material.

While the examples provided in FIGS. 1a, 1b, and 2 were provided using two dimensional waveguide, extension of the above to a three dimensional waveguide of finite extent in z is well known in the art and similar expressions for the cutoff frequencies and dispersion relationships will be clear to the skilled in the art in light of the present specifications.

Having considered the idealized waveguide shown with constant width at FIGS. 1a, 1b, and 2, attention is now given to the effect of tapering in a CRTR having a tapered waveguide core.

Figure 4:
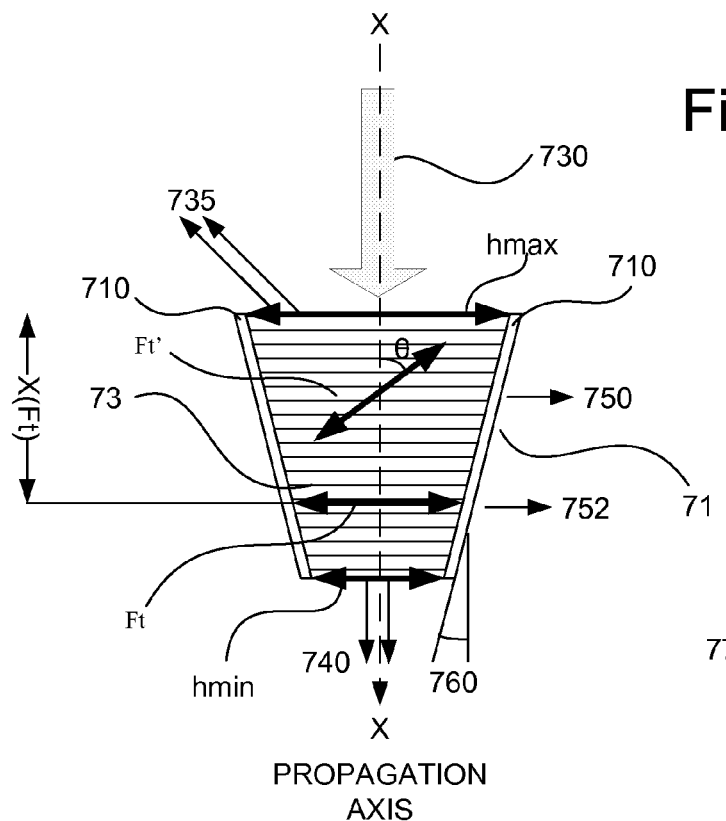
FIG. 4 depicts a cutout of a simplified CRTR.

FIG. 4 depicts a cutout of a simplified Continuous Resonant Trap Refractor (CRTR) which is a waveguide having a tapered core 73 and a cladding 710, and dimensioned as described below. The CRTR allows a wave in the spectral range of interest to propagate in the core until it reaches a cladding penetration state at a frequency dependent width, which is also a frequency dependent depth due to the core taper. The core and cladding are selected to allow the wave to propagate in the waveguide and to depart the waveguide via the cladding. The tapered core 73 has a wide end denoted in FIG. 4 as $h_{max}$ defining an aperture, and a narrow end $h_{min}$ referred to as a tip. The core is bounded between cladding walls 710, which are conductive or have a lower refractive index than the index of the core. The core region may comprise a single region or a plurality of dielectric regions, and in some embodiments a fluid is utilized as the core material. It is noted that the cladding may extend only partially about the core, but the portion which is considered as the waveguide is the portion of the core bounded by cladding in at least two opposing sides of one direction.

At any depth, the core 73 has a plurality of width dimension(s) transverse to the depth dimensions, the width dimensions defining planes for cross-sections of the core transverse to the depth dimension. Stated differently, the width being any direction lying in plane transverse to the depth directions, i.e. a plane that is penetrated by the depth dimension and is substantially perpendicular thereto. The core would have a plurality of such planes, which form cross sections of the core. The cross sections of may be of any geometry and form, and may be symmetrical or asymmetrical. By way of example, $h_{max}$ and $h_{min}$ and Ft denote width extending on both sides of the depth dimension X-X, and each is shown on a different plane. Notably, while those examples denote symmetry about the at least two sides of the depth axis, such symmetry is not required, and other width dimensions on the respective planes may or may not be a varying magnitude. However, by virtue of the taper, considering at least two parallel planes within the core which are transverse to the depth dimension, the plane closer to the aperture will have at least one width dimension having a larger magnitude than at least one width dimension magnitude on the plane that is closer to the tip. While in the example depicted in FIG. 4 the cross-sections are received from a pyramid or a cone with the clipped apex, any desired shape may be selected as long as the width direction is reduced as a function of depth. In the depicted example, the taper forms angle 760 from the vertical.

Electromagnetic radiation admitted via the aperture propagates in the core generally along the depth dimension X-X The tapered core waveguide guides waves from the aperture, generally along the depth dimension X-X extending from the aperture $h_{max}$ towards the tip $h_{min}$. The depth being an axis which extends indefinitely, and in these specifications increases from the aperture towards the tip, such that larger depth implies greater distance from the aperture.

The electromagnetic radiant energy waves admitted via the aperture propagate along the depth dimension until such waves reach a plane of sufficiently constricted cross section, to cause the wave to reach a cladding penetration state. The width of the CRTR core which causes the CPS for a wave of a given frequency is termed the 'emission width' for that wave. The distance of an emission width for a specific wave from the aperture, when measured along the depth direction, is referred to as 'emission depth'.

The core width is dimensioned such that when multi-frequency energy is admitted through the aperture and propagates along the core depth, it will cause a lower-frequency spectral component to reach a cladding penetration state at a first depth, and the core will further taper to a width that will cause energy of a higher-frequency spectral component to reach a cladding penetration state at a second depth, the second depth being larger than the first depth.

Therefore, for a given CRTR spectral range of interest $S_i$, ranging between $\lambda_{max}$ to $\lambda_{min}$ which represent respectively the longest and shortest wavelengths of the spectral range of interest as measured in the core material, wherein $\lambda'$ is at least one wavelength in $S_i$, the dimensions of a frequency splitting CRTR taper are bounded such that a. the aperture size $\psi$ must exceed the size of one half of $\lambda_{max}$;
b. the CRTR core size must also be reduced at least in one dimension, to at least a size $\zeta$ which is smaller than or equal to one half of wavelength $\lambda'$.

Thus the CRTR dimensions must meet at least the boundary of $\{\zeta \leq \lambda'/2 < \lambda_{max}/2 \leq \psi\}$ where the CRTR sizes defined above relate to a size in at least one dimension in a plane normal to the depth dimension. In FIG. 4 the aperture size $\psi=h_{max}$. It is noted however that not all waves in Si must meet the condition b. above. By way of example, certain waves having shorter wavelengths than $h_{min}/2$ may fall outside the operating range of the CRTR. Such waves which enter the CRTR will either be emitted through the tip, reflected back through the aperture, or absorbed by some lose mechanism.

Notably if a third spectral component $\lambda''$ is present, and has a higher frequency than $\lambda'$, it may be emitted at greater depth than $\lambda'$ or be emitted or reflected via the tip, if the tip is constructed to pass a spectral component of frequency $\lambda''$.

The cladding penetration mode of the CRTR may be CPS-FTIR, or CPS-SRC, or a combination thereof.

The CRTR aperture is dimensioned, when operating in splitter mode, to allow the entry of a spectral component having at least the lowest frequency in the spectral range of interest, which means that the longest wavelength in the spectral range of interest for the CRTR is defined by the aperture width in at least one dimension. Notably, the spectral range of interest may be limited by other considerations to shorter wavelengths. The core taper in at least one dimension which must encompass both the emission width of the longest wave in the spectral range of interest as well as an emission width of at least one shorter wavelength within the spectral range of interest. The CRTR either will taper to less than the emission width of the shortest wave in the spectral range of interest or will allow the final portion of the spectral range of interest to exit vertically at a truncated tip of the core. Larger widths than those emission widths at the inlet aperture, or smaller widths than those emission widths at the tip, are allowed.

If the tip is truncated or otherwise allows passage of at least some of the spectral components that were admitted by the aperture, the highest frequency in the spectral range of interest for the CRTR is defined by the longest wavelength that will be emitted via the cladding. If the tip does not allow energy to pass therethrough, the highest frequency in the spectral range of interest for the CRTR is the highest frequency to be emitted via the cladding, and detected or reflected by any desired manner.

As described above, waveguides have a cutoff frequency, which is dictated by the wavelength in the waveguide materials, and the waveguide width. As the frequency of the energy propagating in the waveguide approaches the cutoff frequency $F_C$, the energy propagation speed along the depth of waveguide is slowed down. The energy propagation of a wave may be considered as having a depth dependent varying angle $\theta$ relative to the propagation direction, and thus also relative to the cladding, until a CPS is reached.

If the cladding walls are comparable in width, w, to the skin penetration depth, $\delta$, then energy will transfer across the cladding through frustrated total internal reflection (FTIR) with a transmitted power fraction proportional to $\exp(-2w/\delta)$.

Similarly, if metal cladding is used, and the metal cladding is on the order of the skin penetration depth, $\delta$, which is determined by the resistivity, $\rho$, radian frequency, $w=2\pi F$, and permeability, $\mu$, as $$\delta = \sqrt{\frac{2\rho}{\omega\mu}},$$

then energy will also partially transmit through the metal cladding in proportion to $\exp(-2w/\delta)$.

Thus, refraction by the CRTR occurs in such fashion that spectral components exit the cladding along its side. Even for metal-clad waveguides in which the cladding penetration state may in some cases be reached near the stationary resonance condition, refraction is seldom or never perfectly perpendicular to the waveguide axis. In fact, in most cases this refraction of spectral components in the vicinity of where they reach their cladding penetration states happens in such fashion that the spectral components exit the CRTR at angles much smaller than 90°. This angle will in most cases be closer to 90° in conductor clad waveguide and further from 90° in dielectric cladding. The angle may be computed utilizing the refractive indices of the core material, the cladding, and any surrounding medium, or may simply be determined empirically.

Energy 730 in the spectral range of interest is incident on the waveguide at its aperture, at an angle which permits energy admission. Waves having a lower frequency than the cutoff frequency $F_{min}$ are reflected 735. Waves 740 having frequency higher than $F_{max}$ exit through the tip of the tapered waveguide if an exit exists. Waves having a frequency between $F_{min}$ and $F_{max}$ will reach their emission width, and thus their cladding penetration state, at some distance from the aperture of the waveguide depending on their frequency, as shown schematically by arrows 750 and 752.

In general terms then, when multi-frequency radiant energy is admitted through the CRTR aperture, lower-frequency waves will reach their emission depth before higher-frequency waves, due to their longer wavelength and the taper of the core. As the wave energy departs the CRTR at its emission depth, lower-frequency wave would penetrate the cladding and exit closer to the aperture than higher-frequency wave. Thus, the CRTR will provide spatially separated spectral components along its cladding, while at the same time refracting the spatially separated energy away from the depth axis of the CRTR.

Thus, examining the behavior of a wave of arbitrary frequency $F_t$, where $F_{min}<F_t<F_{max}$, which enters into the waveguide at its aperture at an incidence angle nominally parallel to the propagation axis X-X, the angle $\theta$ between the wave and X-X will vary as the wave propagates along the X-X axis due to the narrowing of the waveguide and increase of the cutoff frequency, as depicted schematically by $F_t$. As the wave approaches emission depth $X(F_t)$ where either the tapered waveguide cutoff frequency equals or nearly equals $F_t$, or the angle $\theta$ approaches the critical angle $\theta_C$, the wave cannot propagate any further within the CRTR core. The wave $F_t$ is thus either radiated through the cladding of the waveguide or is trapped in resonance at depth $X(F_t)$. Considering a perfectly reflective cladding, for a continuum of waves of different frequencies $F_{min}<F_1, F_2, \ldots F_x<F_{max}$, admitted via the aperture of the tapered core waveguide 71 the waveguide becomes a continuous resonant trap, in which the waves of different frequencies become standing waves, trapped at resonance in accordance to their frequency along the X-X axis. Such trapped waves are either leaked through the cladding by the finite probability of "tunneling" though the cladding or are lost to absorption in the waveguide. If the cladding may be penetrated, the tapered core waveguide becomes a continuous resonant trap refractor (CRTR), as the waves are also refracted from the depth axis. This refraction allows directing specific spectral components of the incoming spectrum to predetermined target zones and provides special separating of the spectrum.

The skilled in the art would also recognize that while this simplified explanation describes waves entering the CRTR in parallel orientation to the X-X axis, the operation will be similar on waves having any angle of incidence which is admitted by the waveguide construction.

The tip may be open in the sense that it does not hinder passage of some radiation therethrough, or closed in the sense that it blocks at least a portion of the spectral range of interest. In embodiments where the tip does not taper to a point, energy 740 may be allowed to exit the tip end of the CRTR, or a mirror may be formed at the tip, to reflect unwanted energy back through the aperture.

While the stationary resonant condition described above is generally an ideal condition, the skilled in the art will recognize that in practice it is merely a convenient approximation. The energy velocity slows considerably and the field strength in the cladding material and beyond grows significantly as the cutoff thickness or frequency is approached. It is likely that energy radiation through the cladding walls will occur at thicknesses slightly above the trapped resonance condition.

At 1000 THz (~300 nm UV) the skin depth is only ~2 nm and at 100 THz (~3 μm IR) the skin depth is ~6 nm. A suitably conductive layer of good conductive metal, such as gold, silver, copper or aluminum by way of example, would have a minimum thickness of approximately 30-50 nm and would have a transmission of $4 \times 10^{-18}$ at 300 nm UV. 4 nm metal layers would have a transmission coefficient of ~2% at 300 nm UV. It is desirable that the transmission coefficient be much larger than the absorption losses in the core 73 material. Thinner layers could be deposited if the metal cladding is not relied upon for conducting the power collected from the radiant energy. In many cases, there is a critical thickness to obtain a continuous film of metal and below this thickness, small dots of metal atoms aggregate. Such a "spotted" surface will be semi-transmissive and the transmissivity will be dependent on a number of factors, one of which is incidence angle. Therefore such a partial coverage of conductor is a frequency selective, effective cladding material 710 on a CRTR core since the incidence angle increases as the frequency approaches the cutoff frequency.

Preferably, a thinner film is deposited deep in the tapered structure as compared to the thickness near the inlet, causing the metal coating to thin and become increasingly transparent as the wavelengths are becoming smaller and less able to penetrate the thin film.

Figure 4A:
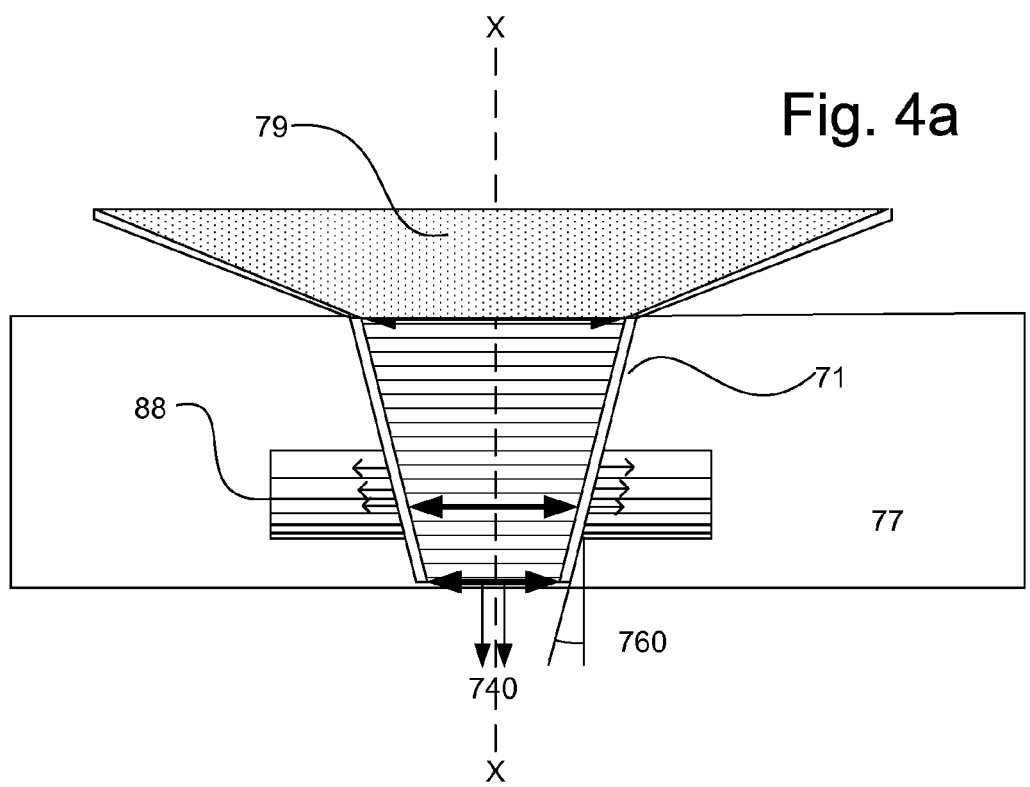
FIG. 4a depicts the refractor with an enlarged inlet for improved collection area.

Furthermore, as seen in FIG. 4*a*, an optional additional waveguide 79 may be utilized to guide incoming waves from larger entry area and/or from varying incidence angles, into the aperture of the CRTR 71.

CRTR's are often disposed within a surrounding structure which will be referred to hereinunder as 'stratum'. In certain embodiments the CRTR 71 waveguide may be surrounded, or embedded in, a stratum 77 containing regions which will receive the spectrally separated refracted radiation. The stratum 77 may comprise a plurality of waveguides, each located to receive the spectral components of multi-frequency energy, which, for convenience, will be referred to as being 'polychromatic'. In some embodiments (not shown) the waveguide may extend away from the CRTR to a transducer or a light source. In certain embodiments the structural material comprises a plurality of stacked waveguide based transducers, depicted schematically as numeral 88. Such stacked transducers are generally referred to as 'lateral waveguides'. Lateral waveguides comprise a plurality of superposed waveguides, each of the superposed waveguides comprising at least a core layer having a radiant energy converter disposed therein, and two cladding layers disposed on opposing sides of the core layer. Preferably the refractive index of the core layer is higher than the refractive index of the CRTR cladding, to ease coupling of radiant energy into the lateral waveguide from adjacent CRTR cladding. Each lateral waveguide has at least one inlet for passage of radiant energy therethrough, the inlet extending between the cladding layers, such that radiant energy entering the waveguide impinges on at least two layers of the waveguide, the inlet further defining a minimum cutoff frequency for the energy to propagate in the waveguide. Stated differently, the energy enters the lateral waveguide in a plane or direction that does not cross or penetrate the thickness direction of the cladding. The incoming radiant energy is simultaneously incident on at least two layers of the waveguide. In most embodiments, the cladding layers are formed of metal. In some embodiments the converters disposed within at least one of the superposed lateral waveguides comprises an electron donor layer and an electron acceptor layers, such as, by way of example a P-N junction, hetero junction, organic and inorganic converters, and the like. In certain embodiments an intrinsic layer is disposed between the electron donor region and the electron acceptor region. Having transducers of differing energy bandgap between differing lateral waveguides is desired to optimize conversion efficiency. Yet another way to increase efficiency is to match the bandgap closely with the spectral range of interest for the specific lateral waveguide, i.e. with the radiant energy that the specific lateral waveguide receives. In one preferred set of embodiments, at least one of the lateral waveguides is dimensioned such that its thickness is only slightly larger than the half the wavelength in the bulk material, of the longest wavelength of the energy it receives. In such embodiment the speed of the energy propagation along the lateral waveguide core is thus significantly reduced. By way of non-limiting example, a lateral waveguide core thickness that is 1-10% larger than the longest wavelength in the spectral range of interest of the lateral waveguide, would allow longer effective length of the converter disposed therewithin, due to significant slowing of the energy propagation therein.

Figure 5:
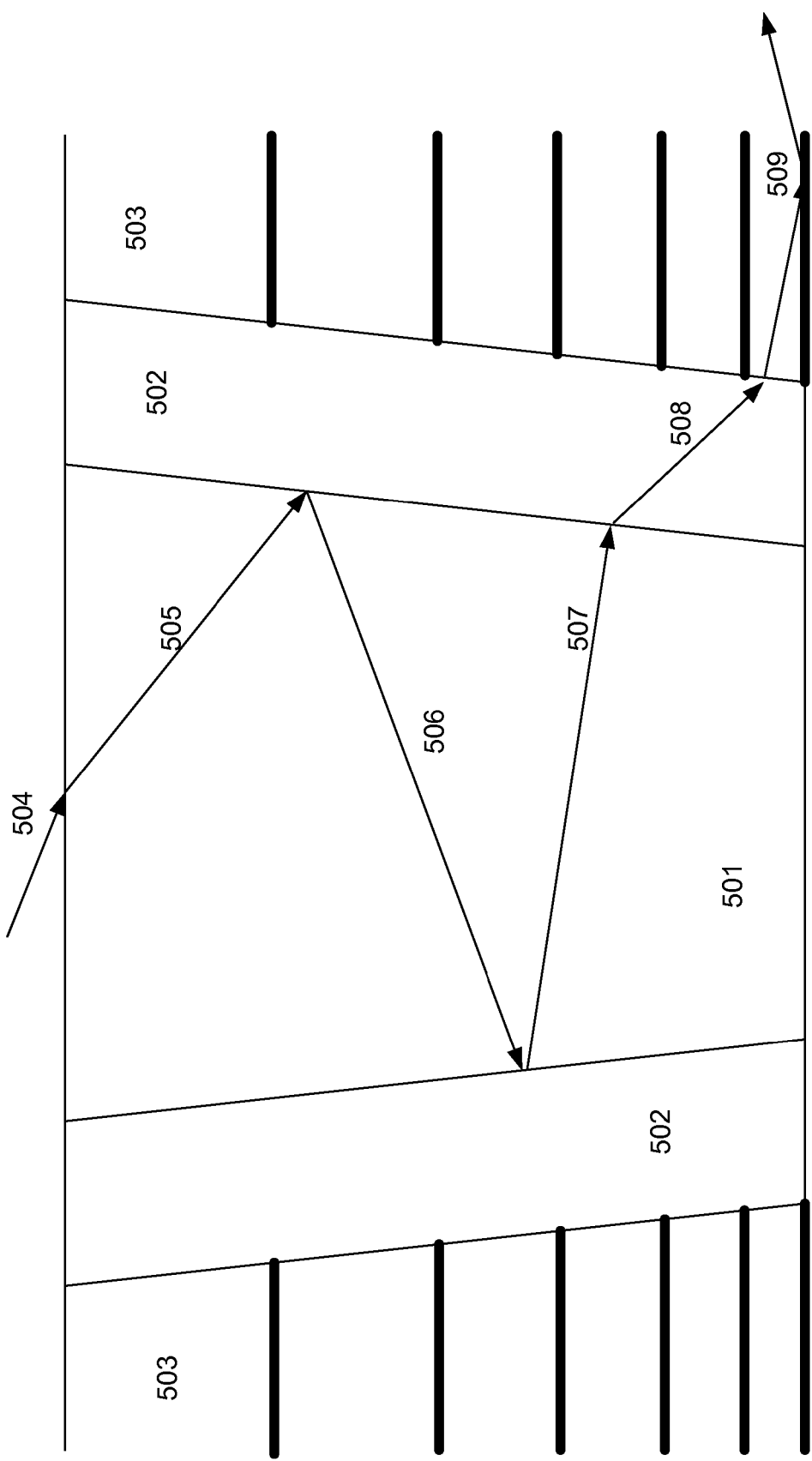
FIG. 5 illustrates the ray diagram of a CRTR having dielectric cladding using total internal reflection as a waveguiding mechanism with energy emission as the total internal reflection critical angle is exceeded.

FIG. 5 shows a wave 504 incident onto a tapered waveguide core 501 and refracted into a waveguide mode. The waveguide mode is simplistically illustrated by rays 505, 506, and 507 of ever larger angle relative to the waveguide boundary. In the case of a dielectric clad waveguide a critical angle exists, beyond which total internal reflection will not occur and the wave is refracted instead of reflected. At a location along the waveguide where the thickness is slightly larger than that resulting in a stationary resonance, the ray angle will reach CPS, or stated differently, exceed the critical angle for total internal reflection and will instead be refracted 508 in the lower index cladding 502 at a steeper angle. For dielectric clad CRTR, the ratio of the core and cladding dielectric constants determines the critical angle above which total internal reflection cannot occur. Below this angle, and therefore above a critical frequency, there is a finite penetration, δ 162, 163, into the cladding. Note that δ increase with decreasing frequency. At a critical frequency that is always higher than the cutoff frequency the critical angle for total internal reflection is reached and the wave will no longer be guided and therefore exits the CRTR before the cutoff frequency depth. If the structural material 503 has an index of refraction higher than that of the cladding, then the ray will refract again, becoming trapped in judiciously located lateral waveguide 509. The ratio of the cladding and transducer dielectric constants determines the angle of emission, which will always be directed downward slightly from perpendicular.

Radiant energy at lower frequencies will exit in a similar manner at a wider point in the tapered waveguide 501, being directed to earlier lateral waveguides and higher frequency radiant energy will exit deeper into the tapered reflector.

Figure 6:
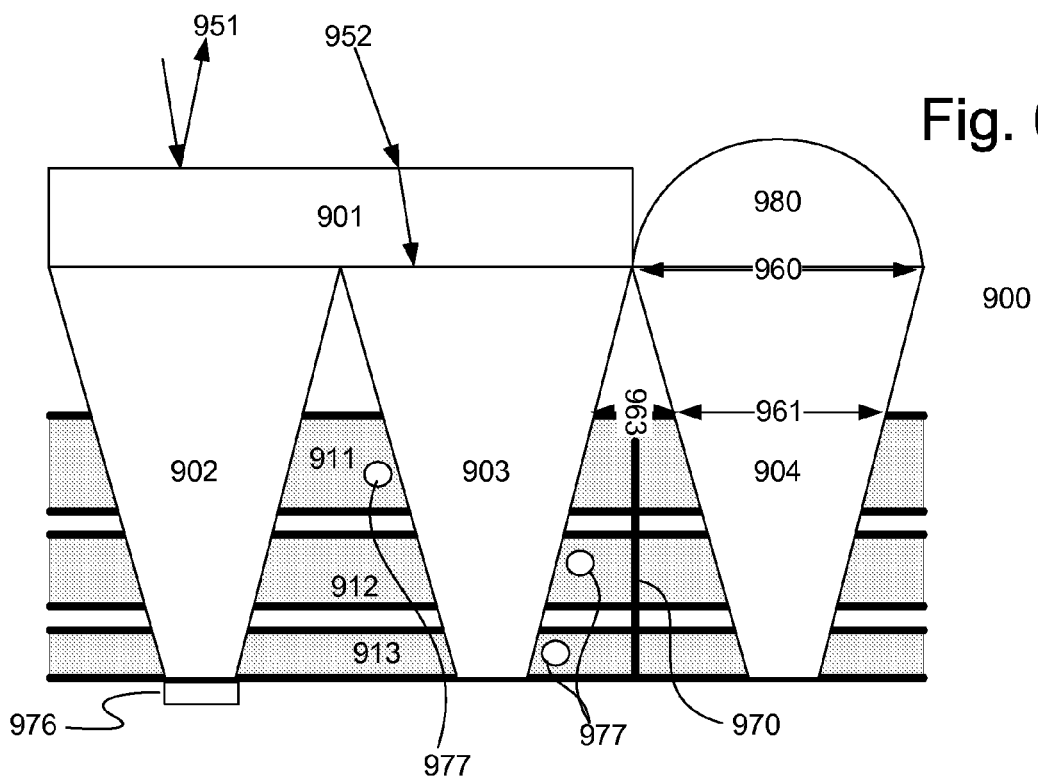
FIG. 6 depicts a simplified cross-section of a radiant energy collector cell, showing different aspects and options of its construction.

FIG. 6 depicts a cross-section of a radiant energy collector cell 900 having high pass filter 901 which reflects incident radiation below frequency, $F_{MIN}$, 951 away from the collector but serves as an anti-reflective coating for the frequencies of interest 952. Use of a high pass filter prevents temperature rise due to nonspecific absorption of unwanted low frequency waves. Optionally a lens 980 may be disposed on top of the CRTR or on top of high pass filter 901. In certain embodiments, the high pass filter is incorporated into the lens. Use of a lens modify the angle of acceptance of CRTR. CRTRs 902, 903, and 904 are contiguous or nearly contiguous at the inlet surface, providing effectively complete collection of incident radiant energy. By making the apertures 960 of the CRTRs wider than the critical width at the lowest frequency of interest, $F_{MIN}$, 961 all desired frequencies are accepted into the waveguides. As the refractors taper, there exists space therebetween 963 for transducers 911, 912, 913.

A CRTR tip may taper to a point, or be of any desired shape. In certain embodiments an excess handler 976 is provided at the tip to handle excess energy such as UV and other energy having higher frequency than the cutoff frequency of the narrowest width of the CRTR. The excess handler may be a mirror for reflecting waves of high frequency that reaches the tip. Alternatively, it may be a hardened converter which is capable of harvesting energy from the excess energy.

The skilled in the art will recognize that the cells depicted herein may operate with or without radiant energy concentrator, while maintaining the same principles of operation and structure.

In a cell arrangement, a plurality of CRTR's is interposed between transducers and the transducers receive the energy from the CRTRs such that a transducer optimized for a given frequency is located at or adjacent to the position where the wave of that frequency reaches a cladding penetration state in the CRTR. A plurality of transducers are spread from the CRTR aperture to the CRTR tip. Each transducer is constructed, by dimension, junction bandgap, waveguide, and other parameters, to most efficiently convert the energy of a certain frequency, and the transducers are positioned so as to receive the maximum energy emanating from the refractor at their optimized frequency.

In the preferred embodiments, a plurality of CRTRs are disposed in a stratum comprising lateral waveguides, which converts the spectrally separated output of the CRTRs into electrical energy. The cladding layers of the lateral waveguides are electrically coupled to their respective transducers and act as charge carriers for it, therefore, the cladding layers are at least partially conductive.

A common converter in a lateral waveguide generally comprises an electron donor region and an electron acceptor region. Optionally, an intrinsic layer is disposed between the electron donor region and the electron acceptor region. Some transducers however are formed differently, such as by rectennas.

In some embodiments each waveguide is optimized to have maximum efficiency at a specific frequency band, which in the context of such embodiments may be referred to as a spectral component, or as the spectral range of interest of the specific lateral waveguide. The waveguides are generally flat, i.e. have a length and width that is significantly larger than their thickness, and are superposed with respect to each other. Radiant energy enters the waveguide from the CRTRs via the apertures located on the waveguides thickness side. One option for optimizing the waveguide involves causing a first converter disposed in a first waveguide among the superposed waveguides to have an energy bandgap that is different from that of a second converter disposed in a second waveguide among the superposed waveguides. If the energy incoming from the embedded CRTRs matches the energy bandgap of the waveguide which receives that energy, the bandgap utilization will be optimized. For practical considerations, the energy emitted from the CRTR is divided into frequency bands and each lateral waveguide receives a band that is best fitted for its conversion efficiency.

Optionally, a transducer disposed in a lateral waveguide will generally have an energy bandgap level that is slightly higher than the photon energy level corresponding to the cutoff frequency of the waveguide. In general, it is desirable to dimension the waveguide thickness just slightly longer than half the longest wave in the spectral range of interest λwi. The longest wave in the spectral range of interest for an individual waveguide within the stacked waveguide, is the longest wavelength that the converter disposed therein can convert. Stated differently, the energy bandgap of the converter dictates the longest convertible wave, and the minimal frequency of the spectrum of interest λwi for such waveguide relates to that minimal frequency. While thickness of about 1-2% above λwi/2 is a desired aperture, it is expensive and often impractical. Aperture ranges such as 10-20% longer than λwi/2 are acceptable for many applications. Waveguide thickness longer than λ would still provide advantages, but would not provide significant extension of the effective length of the photoactive region due to slowing of the energy propagation within the waveguide. Conversely, causing the energy bandgap to be 5% higher than the photon energy level corresponding to the cutoff frequency of the waveguide would in some embodiments be a good compromise between performance and cost.

In some embodiments, the core of at least one of the lateral waveguides comprises a region of transparent conductor disposed between the electron donor region and the cladding and a second region of transparent conductor disposed between the electron acceptor and the cladding. In certain embodiments at least one first converter is an electricity-to-radiant-energy converter, and at least one second converter is a radiant-energy-to-electricity converter.

In certain embodiments an insulating layer may be disposed between at least two of the plurality of the lateral superposed waveguides, while in others the conductive layers of one waveguide may be electrically coupled to the conductive layer, and in some embodiments a single conductive layer may be shared between waveguides of the stack.

FIG. 6 also depicts an optional feature which may be utilized with any solar panel embodiment. Since a CRTR is a linear device, it obeys reciprocity. It is noted that light emitters or reflectors disposed in the stratum are able to couple waves into the CRTR at frequency selective locations, resulting in light emitted or reflected at the aperture of the CRTR being the combination of light injected via the CRTR cladding, or reflected therefrom. This offers changing the appearance of solar cells and similar devices.

As described FIG. 6 depicts a small portion of a radiant energy collector panel which comprises a plurality of superposed lateral waveguides having a plurality of CRTR embedded therein. In this embodiment at least some of the CRTRs operate in hybrid mode, where some of the transducers in the lateral waveguides are LE transducers for energy harvesting, while EL or RL transducers 977 in the lateral waveguides are capable of emitting or reflecting light. The harvested energy is collected or otherwise used as in other embodiments. In some embodiments the color of the whole panel may be modified, while in other embodiments baffles 970 are located between different sections of the panel, turning each section into a "pixel". If the transducers 977 are EL type, electrical energy is selectively provided to the transducers, which in turn emit radiant energy which coupled to the CRTRs via the cladding, mixed in the CRTR core, and emitted via the CRTR aperture. If the transducers 977 are RL type transducers, radiant energy admitted through the aperture is sorted into frequency dependent depth. By controlling the reflective property of the RL type transducers, a controllable portion of the energy admitted via the aperture is reflected back. Both of the above described options offer the ability for controllably varying the color of the energy harvesting panel. If the panel is divided into sections as described, a single panel may have a plurality of pixels, and the appearance of each may be individually modified. Thus either a static color pattern or a dynamically changing image may be formed on the panel. Optionally, a controller may control each transducer separately, producing a large energy harvesting display. Such panels will be useful in many applications such as road signs, programmable house coverings, and the like.

In certain embodiments the panel may be utilized to provide soft lighting. When utilized outdoors, selection of which frequency will be absorbed and which reflected would change the appearance of an object covered by the panel thus allowing programmable changing color of a house for example, while harvesting energy from the panel at the same time. Feeding the panel in electricity should provide lighting at night. Depending on 'pixel' size, a programmable pattern may be displayed on the panel The connection of a controller (Not Shown) to provide the electrical signals to the RL or LE transducer will be clear to the skilled in the art.

While the above example utilizes a power harvesting panel, in combination with the ability to controllably change its appearance. However panel without energy harvesting may also be utilized.

The CRTR based panel presents a IR resistant surface, and allows programmable changing of the panel color, while still allowing energy harvesting.

In certain embodiments, fixed reflectors are used to provide a pre-selected color to the panel, by reflecting a portion of the energy admitted through the CRTR apertures. Such reflectors will be placed instead of at least one of the transducers 977.

Therefore, in an aspect of the invention there is provided a panel comprising a plurality of lateral waveguides having transducers disposed therein, at least one transducer being LE type energy harvesting transducer and at least one emitting transducer being EL type light emitting transducer, or a RL reflective transducer. A plurality of CRTRs is embedded within the lateral waveguides, the CRTRs act as refractors, and the emitting transducer is disposed to controllably couple light into at least one of the CRTRs via the cladding, or reflect light emitted therefrom back thereto.

comprising at least one emitting transducer disposed within at least one of the superposed waveguides, the emitting transducer being EL type light transducer, or a RL reflective transducer, wherein the emitting transducer is disposed to controllably couple light into the CRTR via the cladding, or reflect light emitted therefrom back thereto.

FIG. 7 depicts optional construction two layers within a stacked layer of lateral waveguide based transducers 800 comprising at least one transducer 820 disposed within a waveguide and at least another transducer 810 disposed within a second waveguide with higher cutoff frequency than the transducer 820 of the second waveguide. The transducer 810 disposed within waveguide having a semiconductor materials and P-N junction with higher bandgap energy than the transducer disposed within waveguide transducer 820. While for clarity only two transducers are shown, the invention extends to more than two such lateral waveguide based transducers.

Waveguide based transducer 810 comprises a positive contact conductor 815 and a negative contact conductor 816 separated by optional transparent conductors 811 and 814 between which are disposed p-type 812 and n-type 813 semiconductor layers. The bandgap of the semiconductors 812 and 813 are preferably about equal to each other and correspond to a wave frequency equal or approximately equal to the cutoff frequency of the aggregate waveguide. In this way, energy that is accepted into the waveguide is able to generate electron-hole pairs in the bulk of the semiconductor regions. In some embodiments which use transparent conductors 811 and 814, the regions 812 and 813 are on the order of the diffusion length of carriers in the respective regions such that electron-hole pairs have a high probability of experiencing the junction fields and being directed to the respective sides of the junction. In some embodiments, the combined width of regions 812 and 813 is comparable to the depletion region of the junction formed therebetween. If optional transparent conductors are omitted, the P and N materials will extend to the contact conductors. In most embodiments, the contact conductors are used for both the charge carriers and the cladding, and in most embodiments those contact conductors comprise metal layers.

Similarly, waveguide based transducer 820 comprises a positive contact conductor 825 and a negative contact conductor 826 separated by optional transparent conductors 821 and 824 between which are located p-type 822 and n-type 823 semiconductor layers. However the bandgap and the cutoff frequency of transducer 820 is different than that of transducer 810.

The lateral waveguide based transducers causes energy to impinge laterally, on the side of the junction, and the energy propagates parallel to the junction by virtue of the junction being parallel to the waveguide, as well as from the top and bottom, by virtue of reflective containment within the waveguide. Most of the photons are concentrated near the junction. The lateral penetration allows long conversion area along the junction and at close proximity thereto.

High efficiency is obtained when (a) all significant frequencies of incident energy are directed to a specific transducer in the stack optimized for that frequency, (b) the optimally directed energy travels lengthwise along the waveguide in the stack with a photon energy just slightly in excess of the bandgap, (c) the energy velocity of the optimally directed frequency in the corresponding waveguide is small such that the photons have a high residency time in a comparatively shorter waveguide, (d) the electron-hole pairs that are generated by optical absorption have a high probability of being separated across the junction, and (e) the series resistance through optional transparent conductors is small. Material selection for several waveguide based transducers is provided hereinunder by way of non-limiting example, to assist the practitioner in designing and practicing this aspect of the invention. A layer comprising amorphous silicon offers bandgap energies of about 1.7 eV (0.730 µm) while another layer of poly-silicon or single crystal silicon offers a lower bandgap of 1.1 eV (1.127 µm) and germanium allows 0.67 eV (1.851 µm). Indium gallium arsenide can be selectively varied from 0.36 to 1.43 eV (3.444-0.867 µm), gallium arsenide phosphide can be selectively varied from 1.43 to 2.26 eV (0.549-0.867 µm), aluminum indium arsenide can be varied from 0.36 to 2.16 eV (0.574-3.444 µm), indium gallium nitride can be varied from 2 to 3.4 eV (0.365-0.620 µm), aluminum gallium nitride can be varied from 3.44 to 6.28 eV (0.197-0.360 µm) and silicon-germanium alloys can be varied from 0.67 to 1.1 eV (1.127-1.851 µm). The vast combinations of alloys and junction combinations are a matter of technical choice. Clearly, tailored bandgaps can be selected from 0.36 eV (3.44 µm) or deeper into the infra-red to 6.28 eV (0.197 µm) or higher into the ultraviolet. There are several new materials that are considered promising converter material, belonging to the family of Transition-Metal-Dichalcogenides, such as molybedenum disolfied (MoS2), tungsten diselenide, and other compounds of transition metal and chalocogen element.

Polymer and dye based transducers (also commonly known as 'organic' transducers) enjoy similar and even enhanced advantages as compared to the advantages the present invention provides to semiconductor photovoltaic process. Excitons produced in organic semiconductors are closely coupled electrons and holes with little natural diffusion before recombination. A serious limitation of organic transducers to date is the extremely small diffusion length of these charge carriers. Utilizing the principle of single moded waveguides matched to the bandgap of a polymer based transducer allows utilization of very thin photoabsorptive electron donor layers in close proximity to the electron and hole acceptor layers, which increases the efficiency of such cells.

In the case of organic polymer based transducers, waveguide based transducer 810 comprises a positive contact conductor 815 and a negative contact conductor 816 separated by optional transparent conductors 811 and 814 between which are located electron acceptor 812 and photoabsorptive electron donor 813 semiconductor layers. The optical absorption energy of the donor 813 preferably corresponds to a wave frequency approximately equal to the cutoff frequency of the aggregate waveguide. Heterojunctions between acceptor 812 and donor 813 produces the photovoltaic output. When relating to polymer based transducers, the interface between the electron donor and the acceptor may be considered a junction for practical purposes, whether they form a heterojunction or not.

There are several developmental large bandgap organic semiconductors, with one of the most mature being poly(3-hexylthiophene), P3HT, in a heterojunction with [6,6]-phenyl-$C_{61}$-butyric acid methyl ester (PCBM), obtaining a 5% efficiency. The bandgap of P3HT is around 1.9 eV, limiting the absorbance to below a wavelength of 650 nm. At 650 nm only about 20% of the total amount of photons can be harvested, hence decreasing the bandgap increases the total amount of photons that can be harvested from the solar spectrum.

"Small Bandgap Polymers for Organic Solar Cells (Polymer Material Development in the Last 5 Years), by R. Kroon, M. Lenes, J. Hummelen, P. W. M. Blom, and B. de Boer, Polymer Reviews, 48:531-582, 2008 discusses the efficiency factors of organic semiconductor materials and discusses the need for lower bandgap materials.

The preferred waveguide thickness of a lateral waveguide is dependent on the minimum energy and also on the dielectric constant of the semiconductor. Relative dielectric constants of semiconductors range from about 9 for $Al_xGa_{1-x}N$, 12 for silicon to about 18 for InSb. For providing a nonlimiting design example for solar radiant energy, free space wavelength of 300 nm is considered as an upper limit of interest. 300 nm radiation has a wavelength of 100 nm in $Al_xGa_{1-x}N$, yielding 50 nm as the cutoff point for propagation of such radiant energy through the guide. Selecting a waveguide thickness slightly thicker than the cutoff value is appropriate. The wavelength of 3.3 µm is considered a lower limit of interest for the present example. 3.3 µm radiation has a wavelength of slightly less than 1 µm in $In_xAl_{1-x}As$, yielding 500 nm as the cutoff point for propagation of such radiant energy through the guide.

These relatively thin waveguides offer a significant advantage over the present state of the art when used with the other features of the present invention. By confining the wave to distances from the PN junction of a few hundred nm or less, the internal quantum efficiency is dramatically improved. Prior art utilized normal incidence and thus requiring a larger thickness in order to ensure photon absorption; however these embodiments of the present invention provide for efficient photon absorption by directing the photons along the junction, and in a direction perpendicular to the electric current. In addition to the increased absorption efficiency the thin waveguide utilized lower volumes of expensive semiconductor material.

A. J. Ptak and D. J. Friedman's paper, "Enhanced-Depletion-Width GaInNAs Solar Cells Grown by Molecular-Beam Epitaxy", presented at the 2004 DOE Solar Energy Technologies Program Review Meeting, Oct. 25-28, 2004, details that the diffusion lengths in this material are insufficient for their structure unless the depletion width is increased to 2.5 µm. The material cannot be made thinner in normal-incidence stacked layers because of the low probability of capturing a photon in a smaller propagation path. A decided advantage of certain aspects of the present invention is that carriers have extremely short (25-250 nm in the above examples) vertical electrical path lengths to the junction, while laterally guided photons have an arbitrary interaction length with the semiconductor and are guided at an energy velocity substantially less than the free space speed of light. Internal quantum efficiencies will almost always approach unity and will be limited by the quality of the semiconductor itself. In many cases the junction depletion will approach the waveguide thickness. Photon capture probability will approach unity as well, provided the design of the CRTR and the layering of the waveguide based transducers are adequately balanced. Such construction offer wider design selection of dimensions and P-N materials to increase the total efficiency of a radiant energy converter utilizing those techniques.

By way of non-limiting example, the lateral waveguide thicknesses might vary from 70 nm to 700 nm so as to only allow fundamental waveguide modes at the target frequencies while offering some margin for the cutoff frequencies. The amount by which the thickness exceeds the critical thickness determines the propagation constant of the guided wave. Waves closer to the critical frequency propagate more slowly and interact more with the waveguide layer per unit width. However, waves between the critical frequency and the bandgap energy do not contribute to power conversion and waves above the bandgap energy generate waste heat due to the excess energy. Balancing these competing efficiencies is a matter of technical choice. An optional construction is to make the waveguide begin to accept frequencies slightly (e.g. 10%) above the bandgap energy's equivalent frequency rather than allowing the waveguide to accept energy below the bandgap energy. This ensures that photons admitted into a transducer waveguide will be able to excite charge carriers. On the other hand, if the CRTR efficiently prevents low frequency radiant energy from entering a given waveguide by properly diverting it to a more appropriate waveguide, then it is possible to oversize the waveguides without loss of efficiency due to unconvertible photons. Such construction provides an example of fitting the lateral waveguide thickness (width) to the received frequency band, so as to significantly slow the propagation of the wave, as compared to the propagation of the wave velocity in the bulk material.

When a stratum of lateral waveguides is perforated by a plurality of closely spaced CRTR's the conductive layers viewed in isolation would form a web with narrower paths as the layer is closer to the CRTR aperture. Therefore the layer closest to the aperture would tend to present higher electrical resistance to current collection. To alleviate this problem, in some embodiments the conductive layers closer to the CRTR aperture are thicker than the metal layers further away from the CRTR aperture.

FIG. 8 depicts a detail of one possible arrangement for series-connected lateral waveguide based transducers. Top contact conductor 1110 comprises a conductor compatible with p-type layer 1111 (p-conductor) and is also used 1120, 1130 in contact with p-type semiconductor layers 1121, 1131. Bottom contact conductor 1135 comprises a conductor compatible with n-type layer 1132 (n-conductor) and is also used 1125, 1115 in contact with n-type semiconductor layers 1122, 1112. Optional adhesion or metal compatibility layers between p-conductor and n-conductor layers, as are known in the art, are not shown.

In at least some embodiments, different metals are used to prevent creation of metal-semiconductor Schottkey diodes. In other embodiments the same metal may be used and layers 1115 and 1120 are a single layer, as are layers 1125 and 1130.

The embodiments of FIG. 8 have the advantage that only a single positive contact 1110 and a single negative contact 1135 need be made; however, such a series connected cell will suffer power loss for the power generated in any given cell due to the series losses in the remaining cells.

FIG. 9 depicts a detail of yet another possible arrangement for individually-connected stages. Top contact conductor 1110 comprises a conductor compatible with p-type layer 1111 (p-conductor) and is also used 1120, 1130 in contact with p-type semiconductor layers 1121, 1131. Bottom contact conductor 1135 comprises a conductor compatible with n-type layer 1132 (n-conductor) and is also used 1125, 1115 in contact with n-type semiconductor layers 1122, 1112.

Between each stacked waveguide is a dielectric layer 1218, 1228. By electrically coupling the respective positive +V1, +V2, and +V3 and negative −V1, −V2, and −V3 terminals to an external inverter/combiner circuit, the series resistances and diode voltage drops are minimized. Clearly, larger numbers of cells may be utilized, and parallel and series arrangement as shown in FIG. 11 may be mixed for providing desired voltage/current combinations.

While the above arrangement utilizes either polymer or PN junction transducers, it is recognized that other type of transducers may be advantageously utilized with the CRTR. By way of example, rectenna based transducers and quantum dot based transducers may also be utilized.

FIG. 10 depicts rectenna based transducers. The transducer consists of a plurality of thin, conducting elements being nearly an integral number of half-wavelengths long, suspended between two dissimilar conductors. A stacked array of dielectric layers 1512, 1522, 1532, 1542 between conducting layers 1511, 1521, 1531, 1541 where the layer thicknesses are optimized for a succession of different detection frequencies. Antennas 1513, 1514, 1523, 1524, 1533, 1534, 1543, 1544 are tuned to capture a photon as a resonance of the antennas. At least one connection between each of the conducting elements and the conducting layers forms a rectifying junction 1515. The arrangement is placed on substrate 1501 with DC electrical contacts 1502 and 1503. Optional passivation layer 1509 at least partially encloses the transducer.

FIG. 11 depicts a detail of one possible combiner/inverter circuit arrangement for individually-connected stages. The transducers will each form a voltage source 1310, 1320, 1330 having open circuit voltages determined by the cell materials. The p-type semiconductor or electron acceptors and internal connective layers have series resistance 1311, 1321, 1331. The n-type semiconductor or electron donors and internal connective layers have series resistance 1312, 1322, 1332. There is internal capacitance of the PN junctions 1313, 1323, 1333. Finally there is capacitance between waveguides 1318, 1328.

The internal parallel capacitance per unit area will be determined by the dielectric constant and the depletion width of the PN junction. A 10 cm×10 cm module could represent a capacitance in excess of 100 µF (~1 µF/cm$^2$). Even with as much as half of the area of any given detection layer being dedicated to CRTRs, the capacitance per transducer will be appreciable. Internal resistivity of 3×10$^{-4}$ Ωcm, typical of ITO, with 100 nm (10$^{-7}$ cm) thickness is a series resistance of 3×10$^{-11}$ Ω/cm$^2$. The charge time of the internal cell is negligible. The resistivity of the transparent conductors used within the waveguides is seen not to be limiting and even low conductivity organic conductors are suitable in the waveguides.

Interconnect resistances of the various metal sheets 1314, 1315, 1324, 1325, 1334, 1335, dominates the converter's source resistance. Metallic sheets on the order of 50-100 nm are contemplated with sheet resistance of less than 1 Ω/square. With SPDT switches 1351, 1352, 1353, 1354, 1355, 1356 all connected to the left, capacitors 1361, 1362, 1363 are charged by the short circuit current of voltage sources 1310, 1320, 1330 through the series source resistances.

If the switches are left in this state for part of a cycle of duration T1, the transfer capacitors will charge toward their respective open circuit voltages with a time constant determined by the cell source resistance and their capacitance.

If the SPDT switches set to the right such that the external capacitors are disconnected from the collectors and connected in series with one another and also connected to an external circuit 1370 acting as a load, the combined charge will be delivered to the load at the sum of the voltages, with a time constant determined by the series combination of the external capacitors and the loads resistance for a period T2.

Such an arrangement allows the cells voltages to be additively combined without requiring the currents from one cell to suffer the internal resistances and barrier voltages of all other cells. It is possible to arrange multiple banks, the number being determined by the ratio T1/(T1+T2), such that one bank of capacitors is always transferring power to the load while the others are awaiting available charge from their collectors. Generally, having n banks with T1=n*T2 will allow the switched capacitor transfer element to overcome the internal resistance, effectively decreasing it by a factor of n.

FIG. 12 depicts a basic example diagram showing an inverter/combiner circuit which supports a plurality of DC sources, which in some embodiments may be a plurality of transducers. The DC sources are shown connected in opposite polarities. The sources are depicted as equivalent circuits, such that by way of example, current source I1, diode D1, and parasitic resistance R1 and part of R2 form one DC source equivalent, while I2, D2, and parts of R2 and R3 form the second DC source equivalent, and so forth. Transistors Q1 and Q2 operate as switches to connect the first DC source for charging capacitor C1 during a charge portion of the operation cycle, and transistor Q4 acts to connect capacitor C1 in series with capacitor C2 during a discharge phase of the operation cycle. Similarly, transistors Q3 and Q6 act as charging switches for capacitor C2, while transistor Q5 acts to connect capacitor C2 in series with C3. Other current sources i3-i6, diodes d3-d6, and resistors R3-R7 acts similarly as DC sources, and it is noted that adjacent DC sources are of opposite polarities. The operation of transistors Q7-Q17 will also be recognized as acting similarly to their respective transistors Q1-Q6. Transistors Q18-19 act to connect the serially connected capacitors to the Load. For clarity, certain well known common components like bias and protection components, timing components, and the like, have been omitted.

The arrangement of FIG. 12 is particularly advantageous when the sources are in the form of a +(p/n)−(n/p)+(p/n)−(n/p)+ stack of lateral waveguide, or in any situation where such connection of a plurality of DC sources may be advantageous. A stack as shown offers little or no net voltage across it to be connected in proper potential to an inverter which acts as a summing circuit. This allows waveguide layers with a P and an N metal to be built without dissimilar metal junctions or dielectric spacers, and reduces the risk of electrolytic leakage within the cell. Furthermore, it increases the selection of materials available for creating a lateral waveguide stack as it reduces incompatibility between layers, and may reduce the steps required for creating such stacks. The depicted arrangement however serves only as an example that such arrangement is possible, and the skilled person will recognize in light thereof that the DC sources may be arranged in any desired polarity. Furthermore, in arrangements as shown in FIG. 9, dielectric layers such as 1218, 12228 serve to insulate the different DC sources, further simplifying the design.

When dielectric spacers such as 1218 and 1228 are used, any two adjacent layers separated by a dielectric layer form a capacitor. Those capacitors may be used as the switched capacitors C1-06. Alternatively or in addition, a plurality of metal-insulator-metal layers may be disposed on top of the superposed lateral waveguides, forming the switched capacitors. In certain embodiments the internal capacitance of the individual lateral waveguide based transducers may be used to collect the charge of other transducers. All of the above disclosed capacitors serve to make the converter/combiner circuit more compact and less expensive.

It is noted that any of the inverter/combiner circuits disclosed herein may be advantageously be utilized with any arrangement of DC sources such as for combining batteries and other DC sources, and it is especially advantageous for combining the output of several solar cells of any construction. Optionally, the voltage and charge time of each of the capacitors may be monitored, and the duty cycle of charge/discharge may be adjusted to accommodate differing charges. Thus, if by way of example one solar cell is producing insufficient energy as may happen when a particular cell is shaded (a condition colloquially known as 'dark cell'), its charge time may be modified, or the capacitor may be bypassed. Doing so allows isolating a portion of a solar module which does not produce sufficient output, such as a shaded cell and the like. Bypassing the cell avoids the need for wasteful protection diodes, and buck/boost switchers may mask the voltage differences due to such cell.

The combiner is shown with six level voltage sources V1-V6, by way of example, but it is extendible to an arbitrary number of sources. A charge control line connects capacitors C1 through C6 to layer cells Voc1 through Voc6, via R1 through R7, respectively. In more detail, the positive terminal of voltage source Voc1 is controllably connected via parasitic resistance R1 and switch Q1 (which may be implemented by any switching device such as FET, IGBT, bipolar transistors, and the like), to one terminal of the capacitor C1, while the second terminal of capacitor C1 is controllably connected to the negative side of Voc1 via switch Q2 and parasitic resistance R2. Similar connection is implemented to voltage sources Voc2-Voc6 and C2-C6 respectively. Current, limited by the short circuit current and the RC time constant, flows from the voltage source to the respective capacitor until the charge control line is disabled. The capacitor values may be optimized to equalize the charge cycle times and to provide the same nominal charge on each capacitor at switching.

Upon switching, the discharge switches Q4, Q5, Q8, Q10, Q11, and Q16 cause series connection of the capacitors in the desired polarity. Positive and negative charges recombine almost instantaneously and the nominal charge is now presented at the sum of the voltages of the cells. Considering six cells with bandgaps of 0.67, 0.92, 1.27, 1.75, 2.4, and 3.3 eV and having hypothetical Voc of 0.3, 0.6, 0.9, 1.4, 2.0, and 2.9V an output voltage of 6-8V could be obtained between Q18 and Q19, providing nominal load and lighting conditions. Buck/boost regulating switchers (not shown) could then provide the power in the desired voltage.

Detection circuitry could identify cells that were significantly under-voltage and bypass them with shunting switches in the output chain (not shown), making the module self-correcting to damaged layers or color-filtered light.

The inverter/combiner circuit disclosed herein represents a self-contained inverter. The inverter further offers the advantage of allowing utilization of lateral waveguides stack arranged with opposing polarities. The number of layered voltage sources may be repeated at will. A stack of this type may be constructed with little or no net voltage across the stack, but connected in proper potential to the summing circuit provided.

Such construction is also applicable and beneficial to any and all solar cells, and also provides solution to many 'dark cell' problems in current solar cell designs, its advantages are especially applicable to the solar cell design disclosed herein, as it allows utilizing a single conductive layer to be shared between successive layered waveguides in the lateral waveguides stack. Such layer may also serve as shared cladding to the two waveguides. Yet another advantage is that it allows construction of the lateral waveguide stack without causing dissimilar metal junctions or requiring use of dielectric spacers The potential between the outputs of Q18 and Q19 is a switched potential. If desired the potential may be utilized for charging a filter capacitor, a buck/boost regulating switchers, and DC-AC converters may be used to provide the desired output.

Multiple switched capacitor banks could be sequentially operated to optimize power transfer. A particularly advantageous embodiment (not shown) comprises three banks of transducers being switched at progressive phase differences of 120° to three phases of an alternating current load, providing ease of interfacing to the electrical grid. The use of properly tuned inductive coupling devices filters the unwanted harmonics of the 33% duty cycle square waves in the three phases. The skilled in the art will recognize that such embodiment requires mere change of the timing of the three banks of circuits similar to those shown in either FIG. 10, or 11, and no additional drawing is required Clearly, for all the inverter/combiner circuit embodiments described herein, a controller 1375 controls the operation of the switches (for example control busses marked as "Charge" and "Discharge" in FIG. 12, and optionally for monitoring voltages, phase relationships and the like. While in some embodiments the controller may be a simple pulse train source (and its complement), implementing more elaborate switching controllers will be clear to the skilled in the art.

In a cell arrangement using the lateral waveguides, an edge connector may be utilized to connect the cell to the load. In some embodiments the inverter or portions thereof may be incorporated within the edge connector and/or the lateral waveguide stack. If the capacitors for the inverter incorporate metal layers or other structures within the lateral waveguides, this arrangement is particularly advantageous.

The inverter is also very advantageous in many other applications requiring connection of several voltage sources which may vary in their voltages or output capabilities. Thus for example the inverter may be utilized to maximize and/or optimize output from any combination of voltage sources. Connections of battery cells may benefit as it allows different capacity cells to be connected together with high efficiency. Furthermore, if such arrangement is used in high current applications such as electric vehicles and the like, the arrangement will allow the battery stack to be connected in parallel, keeping high voltage connections only after the inverter. Similarly, in application where complete disconnection of power is undesirable, a single voltage source may be replaced without disrupting the power supplied by the stack of voltage sources, while offering only a low voltage cell to be handled without exposing the workers to the high voltage of the combined output. It also prevents voltage build-up across the layers that can cause electrolytic leakage within the cell.

Optionally, the voltage of charge time of each cell may be measured dynamically by a monitoring system. The monitoring system may then control the switching frequency of all cells, a group of cells, or individual cells, and provide current paths that will optimize power utilization. This is especially beneficial when certain cells in the stack are "shaded", i.e. suffer reduced output. While this is especially useful for non CRTR based cells as those are exposed to partial shading, it may be applicable to CRTR based cells in case of filtering of specific colors as may happen under certain cloudy conditions.

The micro-inverter may also be applied to pn-pn-pn-pn connected cells of standard modules and will provide many of the aforementioned benefits.

FIG. 13 depicts a cutaway view of the edge portion of the solar panel comprising lateral waveguides based transducers, and an edge connector. The layered stratum 470 comprises a plurality of lateral waveguides with some layers 490 being electrical conductors which collect the charges from the transducers. At a predetermined location along the edge of the stratum, the metal conductors 490 extend to the edge of the stratum, and are exposed at least on one side, to allow electrical contact. Edge connector 475 has a plurality of contracts 480 which provide electrical connection to conductor layers 490. Contacts 480 are preferably resilient, but any common connection method may be utilized. The contacts are disposed within the edge connector body 475. Insulating materials 477 and positioning guides 478 are disposed as desired to assure positive contact, proper inter-contact insulation, connector positioning, and the like. The edge connector 475 may also provide sealing function to the connection, by any desired sealing method, depicted schematically as seal 485. The skilled in the art would recognize that various sealing methods may be deployed, at any desired location. The edge connector is urged against the stratum as shown by arrows 489. Optionally, the edge connector further encompasses a portion of the substrate, if a substrate exists. It is noted that the number of layers and contacts shown are merely to facilitate understanding of the construction and are any desired number of contacts and layers may be utilized. Furthermore, in some embodiments the conductor layers 490 may be staggeringly exposed along the stratum edge such that each conductor 490 is exposed separately along a portion of the edge (not shown).

FIG. 14 depicts a simplified diagram of an optional manufacturing method for continuous resonant trap refractors suspended in surrounding lateral waveguides. Substrate 601 material selection is a matter of technical choice and is determined by the nature of the application and the construction of the layers within the lateral waveguides. Lateral waveguides 602 contain frequency-selective and/or frequency-optimized transducers, and are disposed upon the substrate 601, as seen in (*a*). An optional buffer layer 603 is then disposed upon lateral waveguides 602 (*b*).

A patterned etch using methods such as wet etch, plasma etch, reactive ion etch, LIGA, ion milling, and the like, is employed to form pits 604 as seen in stage (*c*). In at least some embodiments it is desirable that the surface be almost completely covered with pits 604, ensuring that virtually all of the radiant energy incident on the system will enter one of the pits. A two-step process having a slower taper in the transducer region and a faster taper in the buffer material might be desirable as per FIG. 4*a* but is not shown. Further, different etch rates may be caused by the different materials being removed, and system parameters may need to be adjusted to accommodate such differing etch rates.

Cladding material 605 is applied using any applicable deposition methods such as ALD, evaporation, sputtering, CVD, epitaxial growth, and the like (*d*). Finally, the pits are filled with the core material 606 and an optional protective or antireflective coating 607 is applied (*e*).

In the case of conductive cladding material 605, the dielectric constant of the core material 606 is arbitrary. It is permissible to use air, inert gas, or a cooling liquid of controlled dielectric constant and sufficiently low optical absorbance. Perfluoropolyether and fluoroalkane liquids have very reproducible properties, excellent optical transparency, low viscosity and good wetting to hydrophobic metals. Mixtures of related fluids may be used to tune the dielectric constant in operation. These materials have excellent heat transfer properties and could be used to remove excess heat by flowing in the z-direction along defined ridges if the etched regions form long slots.

Both low-k and high-k solid dielectrics are also suitable to the metal clad system; however, for the dielectric clad system the cladding material must have a lower dielectric constant (lower index of refraction) than the tapered waveguide core. This favors low-k solids such as aluminum oxide, silicon dioxide, or polymers for the cladding and high-k transparent materials for the core. Water and other aqueous liquids allow the same fluid cooled system while using an alcohol/water or other suitable mixture to continuously adjust the dielectric constant of the core. Hafnium oxide is a well-known high-k material from the semiconductor industry.

FIG. 15 depicts an alternate manufacturing method, and the depiction is directed at solar converter device, where the spectral range of interest of the device as a whole is directed generally to the solar spectrum, which will be referred to as light. Optical material 701 is first coated with optical coatings 702, such as antireflective and protective layers (a). An etch mask 703 is then defined on the opposite face of the optical material and the region between the desired refractors 704 is removed (b). The masking dimensions define the bottoms of the tapered waveguides, and therefore the highest frequency to be refracted by the CRTRs. The etch profile determines the optical aperture 705 and therefore the minimum frequency.

Cladding layers (dashed dark lines) 706 are then deposited (c). Layers of transducer structure 707 are then deposited (d).

In the manufacturing method of FIG. 13, the quality and reproducibility of the waveguide-based transducers is favored, and especially the thicker, lower frequency waveguides deposited earlier in the stack. Additive formation of the refractor waveguide cores can lead to variability and loss of efficiency due to voids, bubbles, polycrystallinity, and the like. This method would be especially beneficial for fluid or gaseous CRTR cores or for cases wherein the layered transducer deposition required thermal processes that were incompatible with the cladding or core materials of the refractors or the subsequent protective layers.

In the manufacturing method of FIG. 14 the quality and reproducibility of the refractors is favored. Subtractive definition of the cores and additive coverage of the cladding layers clearly defines the refractor structures with no loss of quality from the initial optical material 701. In at least some embodiments, optical coatings 702 may be added at a later stage or not at all. Definition of the lateral waveguides and electrical connections can become troubling however and increasingly so as thicker and lower energy layers are deposited upon earlier layers. The choice of manufacturing method for the CRTRs is a matter of technical choice, and would likely vary with the material selection of the lateral waveguides within which they are to be embedded.

It is desirable to minimize the path length between creation of an electron/hole pair and the junction wherein they will be separated to create current flow. The desire for thin waveguiding layers favors the use of fundamental modes in at least some layers within some applications to minimize diffusion lengths of carriers.

In some layers within some applications, the preferred waveguide thickness at the fundamental mode may be too thin for low cost manufacture and it may be desirable to employ a higher order mode with a correspondingly thicker waveguide for manufacturing simplicity.

It is further noted that while the figures depict CRTRs with continuously smooth taper, different tapers may be utilized, and logarithmic, radial, non-linear, stepwise and any other arbitrary tapers which would provide the series of successively narrower waveguide regions, would trap waves of successively higher frequencies into resonance and/or emit successively higher frequencies at increasing distances from the inlet. Therefore the invention extends to such embodiments as well.

Solar radiation comprises a broad range of frequencies, and thus is commonly referred to as polychromatic. In the present specification the terms radiant energy, solar energy, and light are used synonymously unless inherently clear otherwise. Those terms relates to energy ranging from the IR to the UV and beyond, regardless of the source, and are not limited to the visible light or to energy incident directly or indirectly from the sun.

It is further noted that the arrow angles and dimensions in the drawing are provided primarily for clarity only and often do not represent the actual angle of reflected waves.

More complicated waveguides are readily considered having multiple dielectric layers between conductors and are well known in the literature. Similarly waveguides formed between multiple layers of lower dielectric constant are also well known.

As the structure of CRTRs and lateral waveguide with embedded transducers is thin and may be made flexibly, an aspect of the invention calls for a wearable article such as clothing, hat, pack, and the like, for energy harvesting. The device comprising a plurality of superposed waveguides having a plurality of transducers disposed therewithin, and a plurality of CRTRs disposed within the superposed waveguides. Such article is not shown as it may be any wearable item, and such device may utilize any of the embodiments provided herein.

It should be noted that the stationary resonant condition can never be reached since, as the energy velocity approaches zero the time scale extends until leakage and loss conditions become dominant. As used in the present application, stationary resonance condition encompasses all conditions beyond which a guided wave cannot pass due to changes in the local waveguide cutoff frequency.

It will be appreciated that the invention is not limited to what has been described hereinabove merely by way of example. While there have been described what are at present considered to be the preferred embodiments of this invention, it will be obvious to those skilled in the art that various other embodiments, changes, and modifications may be made therein without departing from the spirit or scope of this invention and that it is, therefore, aimed to cover all such changes and modifications as fall within the true spirit and scope of the invention, for which letters patent is applied.

We claim:

1. An energy converter for converting multi-frequency radiant energy into electrical energy, the converter comprising:
   a plurality of superposed waveguides, at least a first and a second of the superposed waveguides each having an inlet and comprising:
   a core having a photoactive conversion zone for converting radiant energy entered via the inlet into electrical energy, the photoactive conversion zone forming a transducer;
   the core being disposed between charge collectors for collecting electrical energy from the conversion zone, and
   a superposed waveguide cladding disposed about the core;
   wherein each of the first and second superposed waveguides is constructed to guide incoming energy in a direction substantially along the respective waveguide;
   at least one spectral refractor comprising:
   a tapered core having a first end and a second end, the first end defining an aperture, the tapered core having a depth with direction and magnitude the depth direction extending between the first end and the second end, wherein the depth magnitude increases with distance from the first end towards the second end;
   the tapered core having a width in at least one direction transverse to the depth direction;
   the tapered core width monotonically decreasing in magnitude as a function of the depth;
   a refractor cladding disposed at least partially about the tapered core;
   wherein the first end of the tapered core is dimensioned to allow passage of radiant energy comprising at least a first and a second spectral components each having at least one frequency associated therewith, wherein the first spectral component has a lower frequency than the second spectral component; and, wherein the tapered core will cause the first and the second spectral components reaching a respective cladding penetration state at which they will respectively penetrate the refractor cladding and be emitted from the at least one spectral refractor at a respective first and second depths, wherein the first depth is of lesser magnitude than the second depth;

wherein the at least one spectral is at least partially disposed within the plurality of the superposed waveguides such that the first spectral component will couple into the inlet of the first superposed waveguide, and the second spectral component will couple into the inlet of the second of the superposed waveguide.

2. A converter as claimed in claim 1, wherein the charge collectors of at least one of the plurality of superposed waveguides are also the cladding therefor.

3. A converter as claimed in claim 1, wherein the transducer disposed within the first superposed waveguide is optimized to at least one frequency in the first spectral component, and the transducer disposed within the second superposed waveguide is optimized to at least one frequency in the second spectral component.

4. A converter as claimed in claim 1, wherein at least one of the transducers is selected from a group consisting of an inorganic photovoltaic converter, an organic photovoltaic converter, a quantum-dot-based converter, an electrochemical radiant energy converter, a thermoelectric energy converter, rectenna based converter, antenna based converter, Transition-Metal-Dichalcogenides converter, and any combination thereof.

5. A converter as claimed in claim 1, wherein the refractor cladding comprises metal.

6. A converter as claimed in claim 5, wherein the metal refractor cladding comprises discontinuous metal.

7. A converter as claimed in claim 5 wherein the thickness of the refractor cladding is in the order of, or thinner than, the penetration depth for at least one frequency, at or about the depth corresponding to the cladding penetration state of the at least one frequency.

8. A converter as claimed in claim 1, wherein the refractor cladding comprises a dielectric material, or a composition thereof.

9. A converter as claimed in claim 1, wherein the thickness of the converter cladding is smaller than $3/4$ of the wavelength of at least one frequency, at or about the depth corresponding to the cladding penetration state of the at least one frequency.

10. A converter as claimed in claim 1, wherein the tapered core is in the form of an elongated wedge.

11. A converter as claimed in claim 1, wherein the superposed waveguides are planar and having an edge, and wherein at least two of the charge collectors are electrically coupled to contact regions near the edge.

12. A converter as claimed in claim 1, further comprising at least one emitting transducer disposed within at least one of the superposed waveguides, the emitting transducer being electrical energy to radiant energy transducer, or a reflective transducer, wherein the emitting transducer is disposed to controllably couple light into the tapered core via the refractor cladding, or reflect light emitted the tapered core back thereto.

13. A refractor as claimed in claim 1, wherein the tapered waveguide core comprises a fluid.

14. A converter as claimed in claim 1, wherein the second end of the tapered core allows passage of a portion of energy admitted via the aperture.

15. A converter as claimed in claim 1, further comprising of a reflector dispose at or near the second end of the tapered core, for reflecting a portion of the energy admitted via the aperture.

16. A converter as claimed in claim 1, further comprising a transducer disposed at or near the second end of the tapered core.

17. A converter as claimed in claim 1, further comprising an anti-reflective coating disposed over the first end.

\* \* \* \* \*